(12) United States Patent
Wu et al.

(10) Patent No.: US 11,956,994 B2
(45) Date of Patent: Apr. 9, 2024

(54) OLED LIGHT FIELD ARCHITECTURES

(71) Applicant: Applied Materials, Inc., Santa Clara, CA (US)

(72) Inventors: Chung-Chih Wu, Taipei (TW); Hoang Yan Lin, Keelung (TW); Guo-Dong Su, Taipei (TW); Zih-Rou Cyue, New Taipei (TW); Li-Yu Yu, New Taipei (TW); Wei-Kai Lee, Taipei (TW); Guan-Yu Chen, New Taipei (TW); Chung-Chia Chen, Hsinchu (TW); Wan-Yu Lin, Taipei (TW); Gang Yu, Santa Barbara, CA (US); Byung-Sung Kwak, Mountain View, CA (US); Robert Jan Visser, Menlo Park, CA (US); Chi-Jui Chang, Taipei (TW)

(73) Assignee: Applied Materials, Inc., Santa Clara, CA (US)

( * ) Notice: Subject to any disclaimer, the term of this patent is extended or adjusted under 35 U.S.C. 154(b) by 424 days.

(21) Appl. No.: 17/398,442

(22) Filed: Aug. 10, 2021

(65) Prior Publication Data
US 2022/0059803 A1    Feb. 24, 2022

Related U.S. Application Data

(60) Provisional application No. 63/068,326, filed on Aug. 20, 2020.

(51) Int. Cl.
*H10K 50/858* (2023.01)
*G09F 9/33* (2006.01)
*H04N 13/302* (2018.01)

(52) U.S. Cl.
CPC .......... *H10K 50/858* (2023.02); *G09F 9/335* (2021.05); *H04N 13/302* (2018.05)

(58) Field of Classification Search
CPC .................. H10K 50/858; H04N 13/302
See application file for complete search history.

(56) References Cited

U.S. PATENT DOCUMENTS 10,468,463 B1 * 11/2019 Chen ............... H10K 59/35
11,588,137 B2 * 2/2023 Yamazaki ........ H10K 59/122
(Continued)

FOREIGN PATENT DOCUMENTS

| CN | 102179971 B | 4/2014 |
| CN | 109585663 A | 4/2019 |

(Continued)

OTHER PUBLICATIONS

Feng, Jing et al., "Light manipulation in organic light-emitting devices by integrating micro/nano patterns", Laser & Photonics Reviews, Feb. 2017, pp. 1-20, <http://cufo.jlu.edu.cn/_local/3/92/A7/ACD31C6AD8D7C240892ABDA96E6_87106E2B_283949.pdf>.

(Continued)

*Primary Examiner* — Nathan W Ha
(74) *Attorney, Agent, or Firm* — Patterson + Sheridan, LLP

(57) ABSTRACT

The present disclosure is generally related to 3D imaging capable OLED displays. A light field display comprises an array of 3D light field pixels, each of which comprises an array of corrugated OLED pixels, a metasurface layer disposed adjacent to the array of 3D light field pixels, and a plurality of median layers disposed between the metasurface layer and the corrugated OLED pixels. Each of the corrugated OLED pixels comprises primary or non-primary color subpixels, and produces a different view of an image through the median layers to the metasurface to form a 3D image. The corrugated OLED pixels combined with a cavity effect reduce a divergence of emitted light to enable effective beam direction manipulation by the metasurface. The metasurface (Continued)

having a higher refractive index and a smaller filling factor enables the deflection and direction of the emitted light from the corrugated OLED pixels to be well controlled.

20 Claims, 16 Drawing Sheets

(56) References Cited

U.S. PATENT DOCUMENTS

| | | | | |
|---|---|---|---|---|
| 2004/0206965 | A1* | 10/2004 | Evans | H10K 50/858 257/85 |
| 2006/0175961 | A1* | 8/2006 | Choong | H10K 50/852 313/506 |
| 2010/0289017 | A1* | 11/2010 | Ha | H10K 50/828 257/40 |
| 2012/0098421 | A1* | 4/2012 | Thompson | B32B 27/08 428/315.9 |
| 2015/0145975 | A1* | 5/2015 | Ko | H04N 13/305 345/589 |
| 2015/0207107 | A1* | 7/2015 | Schwartz | G03F 7/091 156/60 |
| 2015/0228931 | A1* | 8/2015 | Lamansky | G02B 5/1866 257/40 |
| 2015/0338666 | A1* | 11/2015 | Zhou | H10K 85/791 359/618 |
| 2017/0034503 | A1* | 2/2017 | Zhou | H10K 59/35 |
| 2017/0084669 | A1* | 3/2017 | Wolk | H10K 50/858 |
| 2018/0045953 | A1* | 2/2018 | Fan | G02B 1/002 |
| 2018/0267362 | A1* | 9/2018 | Gahagan | G02F 1/133504 |
| 2019/0020842 | A1* | 1/2019 | Jeong | G02B 5/1876 |
| 2019/0103442 | A1* | 4/2019 | Choi | H10K 50/822 |
| 2019/0178714 | A1* | 6/2019 | Faraji-Dana | G02B 5/1847 |
| 2019/0386250 | A1* | 12/2019 | Suzuki | H10K 50/858 |
| 2020/0006437 | A1* | 1/2020 | Kim | H10K 59/38 |
| 2020/0028120 | A1* | 1/2020 | Sugitani | G02F 1/0316 |
| 2020/0035948 | A1* | 1/2020 | Song | H10K 50/82 |
| 2020/0058709 | A1* | 2/2020 | Lee | H10K 50/11 |
| 2020/0058721 | A1* | 2/2020 | Sim | H10K 50/858 |
| 2020/0058904 | A1* | 2/2020 | Kim | H10K 50/858 |
| 2020/0091226 | A1* | 3/2020 | Hwang | H01L 33/405 |
| 2020/0105846 | A1* | 4/2020 | Liu | G02B 1/118 |
| 2020/0124866 | A1* | 4/2020 | Camayd-Munoz | G02B 1/002 |
| 2020/0185654 | A1* | 6/2020 | Luo | H10K 50/858 |
| 2020/0243802 | A1* | 7/2020 | Ju | H10K 50/86 |
| 2020/0251689 | A1* | 8/2020 | Pan | H10K 59/38 |
| 2020/0295308 | A1* | 9/2020 | Baek | H04N 13/307 |
| 2020/0388658 | A1* | 12/2020 | Tsaur | H10K 59/32 |
| 2021/0091340 | A1* | 3/2021 | Sun | H10K 50/858 |
| 2021/0118938 | A1* | 4/2021 | Roberts | H01L 27/14689 |
| 2021/0234116 | A1* | 7/2021 | Li | H10K 50/858 |
| 2021/0249634 | A1* | 8/2021 | Wang | H10K 50/844 |
| 2021/0305540 | A1* | 9/2021 | Guo | H10K 50/844 |
| 2021/0313485 | A1* | 10/2021 | Montgomery | H01L 27/156 |
| 2021/0399056 | A1* | 12/2021 | Wang | H10K 50/844 |
| 2021/0399263 | A1* | 12/2021 | Montgomery | H10K 50/15 |
| 2022/0077427 | A1* | 3/2022 | Lee | H10K 59/40 |
| 2022/0085334 | A1* | 3/2022 | Oh | H10K 50/858 |
| 2022/0299760 | A1* | 9/2022 | Fan | G02B 27/0012 |
| 2023/0180585 | A1* | 6/2023 | Xia | H10K 59/879 257/40 |

FOREIGN PATENT DOCUMENTS

| | | |
|---|---|---|
| KR | 20140037092 A | 3/2014 |
| KR | 20190049374 A | 5/2019 |
| KR | 20190119098 A | 10/2019 |
| TW | 200533229 A | 10/2005 |
| TW | 201234583 A | 8/2012 |
| TW | 202029497 A | 8/2020 |

OTHER PUBLICATIONS

International Search Report dated Dec. 1, 2021 for Application No. PCT/US2021/045325.

Hsu et al. "Vertical split-ring resonator based anomalous beam steering with high extinction ratio," 2015, Scientific Reports, vol. 5, No. 11226, DOI: 10.1038/srep11226.

Khorasaninejad et al. "Achromatic Metalens over 60 nm Bandwidth in the Visible and Metalens with Reverse Chromatic Dispersion," 2017, Nano Letters, vol. 17, pp. 1819-1824, DOI: 10.1021/acs.nanolett.6b05137.

Khorasaninejad et al. "Metalenses at visible wavelengths: Diffraction-limited focusing and subwavelength resolution imaging," Science, vol. 352, No. 6290, Jun. 3, 2016, pp. 1190-1194, DOI: 10.1126/science.aaf6644.

Kildishev et al. "Planar Photonics with Metasurfaces," Science, New York, N.Y., vol. 339, Mar. 15, 2013, pp. 1232009-1-1232009-6, DOI: 1232009. 10.1126/science.1232009.

Liu et al. "Fully Controllable Pancharatnam-Berry Metasurface Array with High Conversion Efficiency and Broad Bandwidth," Scientific Report, vol. 6, No. 34819, 2016, <https://doi.org/10.1038/srep34819>.

Pahlevaninezhad et al. "Nano-optic endoscope for high-resolution optical coherence tomography in vivo," 2018, Nature Photonics, vol. 12, pp. 540-547, <https://doi.org/10.1038/s41566-018-0224-2>.

Taiwan Office Action dated Feb. 5, 2024 for Application No. 110129558.

* cited by examiner

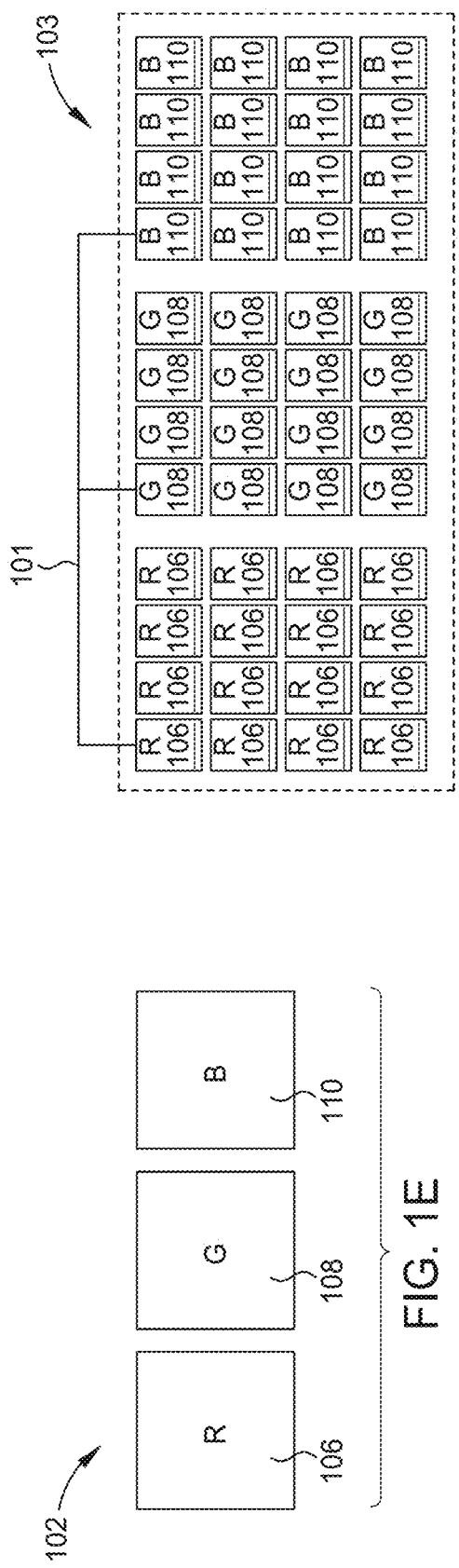
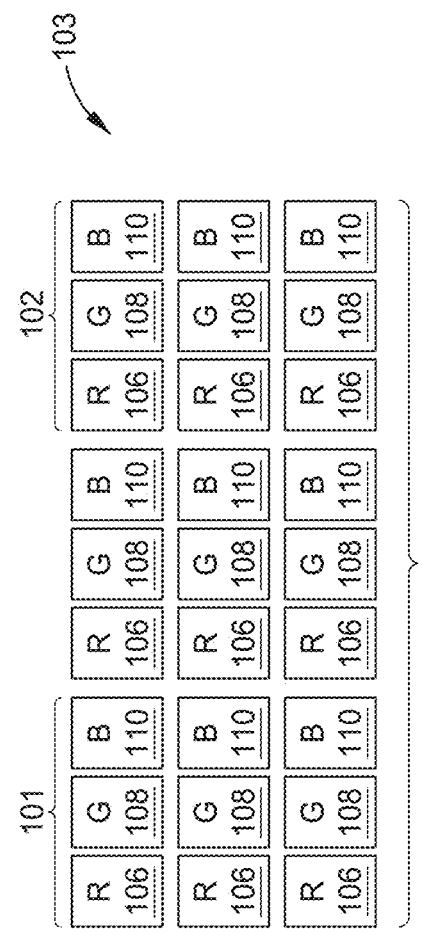

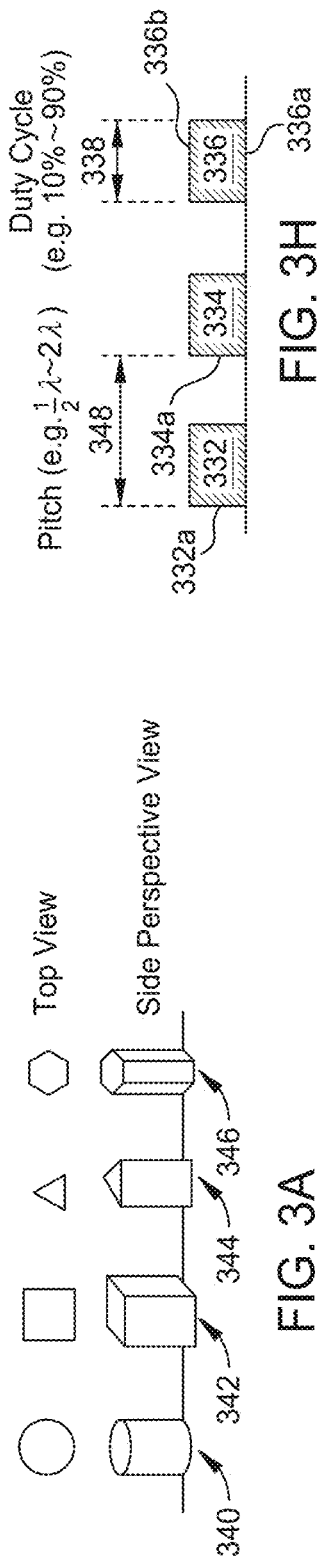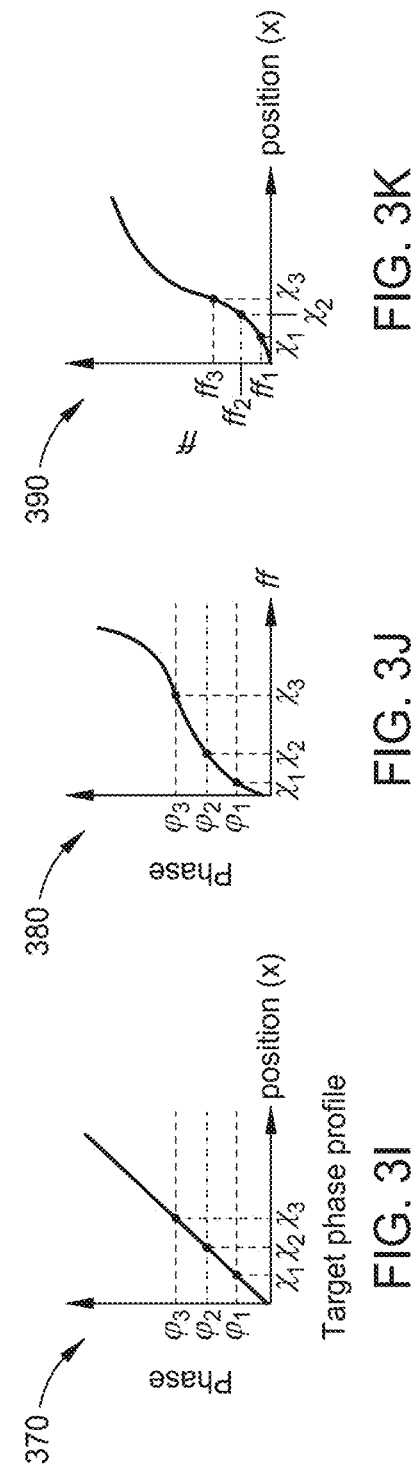

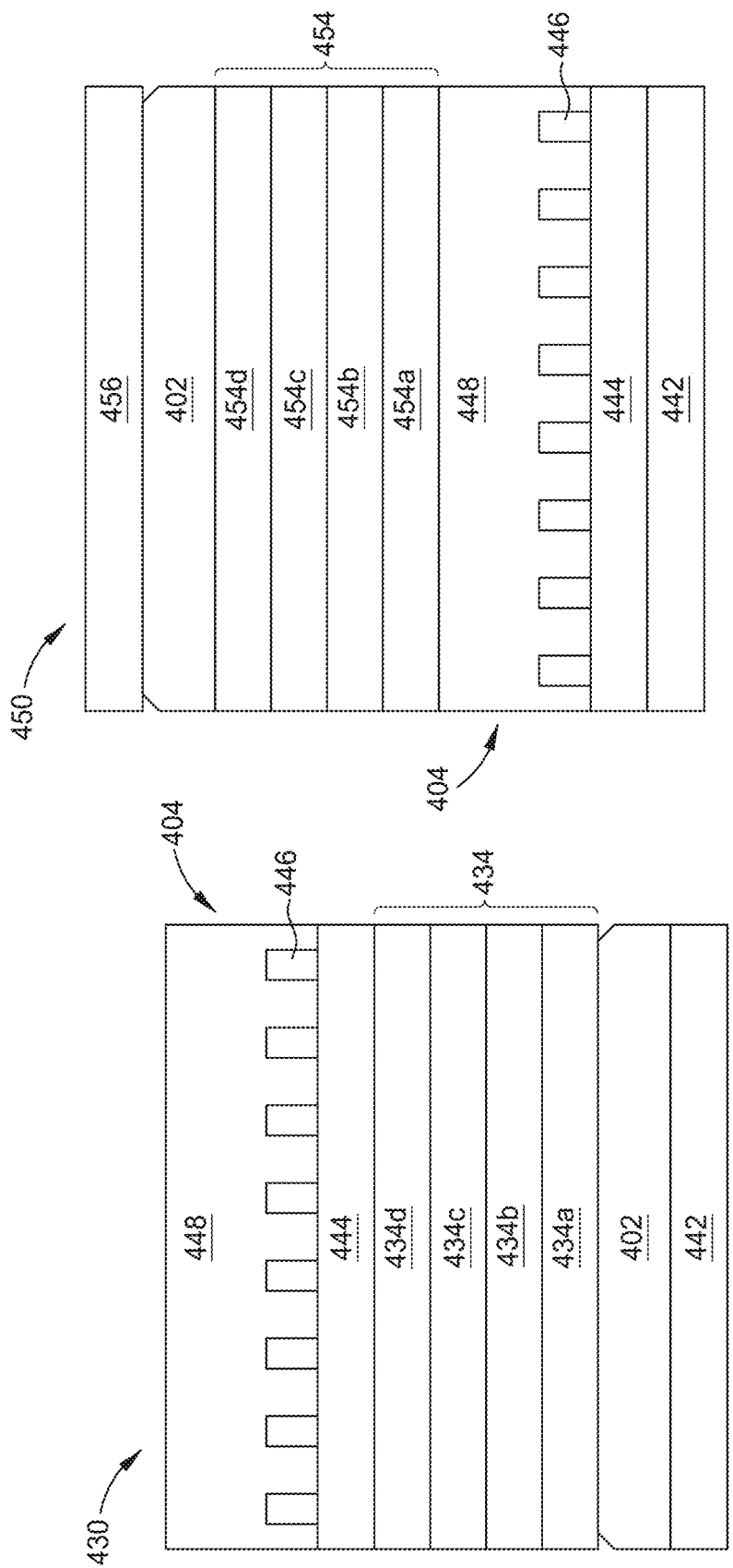

OLED LIGHT FIELD ARCHITECTURES

CROSS-REFERENCE TO RELATED APPLICATIONS

This application claims benefit of U.S. provisional patent application Ser. No. 63/068,326, filed Aug. 20, 2020, which is herein incorporated by reference.

BACKGROUND

Field

Embodiments of the present disclosure generally relate to organic light emitting diode (OLED) displays, and more specifically, to three dimensional (3D) image capable OLED displays.

Description of the Related Art

Over the past few years, various technologies have been studied to produce 3D images and 3D displays. Currently, liquid crystal display (LCD) technologies are being utilized to create such 3D images and displays. However, LCDs generally have a lower display quality than OLED displays. Using OLED displays to create high display quality 3D images can be challenging due to the emission characteristics of OLEDs. For example, the emission spectra of OLEDs can have broad spectral characteristics, and the emission profile of OLEDs has a Lambertian pattern (i.e., bottom emitting) or in general, a wide viewing angle (depending on the device structure). These emission characteristics can result in ghost images and other undesirable artifacts.

Therefore, there is a need in the art for OLED devices capable of creating and projecting high display quality 3D images without undesirable artifacts.

SUMMARY

The present disclosure is generally related to 3D imaging capable OLED displays. A light field display comprises an array of 3D light field pixels, each of which comprises an array of corrugated OLED pixels, a metasurface layer disposed adjacent to the array of 3D light field pixels, and a plurality of median layers disposed between the metasurface layer and the array of corrugated OLED pixels. Each of the corrugated OLED pixels of the light field array comprises primary color subpixels, and produces a different angle or view of a 3D image through the median layers to the metasurface to form a 3D image. The corrugated OLED pixels combined with a cavity effect reduce a divergence of emitted light to enable effective beam direction manipulation by the metasurface. The metasurface having components with higher refractive indices, a shorter period of building blocks, and a larger overall thickness, enables the deflection and direction of the emitted light from the corrugated OLED pixels to be well controlled. The metasurface layer comprises multiple types and structures within each 3D light field pixel from the need to direct emission in the different views of a 3D image and to account for the wavelength effect of each primary color.

In one embodiment, a light field display comprises one or more self-emitting and high directivity light sources, one or more beam manipulating elements disposed adjacent to the one or more self-emitting and high directivity light sources, and a plurality of median layers disposed between and in contact with the one or more beam manipulating elements and the one or more self-emitting and high directivity light sources, wherein each of the one or more self-emitting and high directivity light sources produces a different angle or view of a same image to form a 3D image.

In another embodiment, a light field display comprises an array of corrugated OLED pixels, the array comprising three or more primary color subpixels, one or more metasurfaces disposed adjacent to the array of OLED pixels, the one or more metasurfaces each comprising a plurality of nanorods, and a plurality of median layers disposed between and in contact with the one or more metasurfaces and the array of OLED pixels, wherein each of the OLED pixels in the array produces a different angle or view of a same image to form a 3D image.

In yet another embodiment, a light field display comprises a matrix of OLED pixels, the matrix comprising three or more primary color subpixels. Each of the OLED pixels or the matrix comprises a corrugated surface. A corrugation height of the corrugated surface is about 5 nm to about 500 nm, and a corrugation period of the corrugation surface is about 100 nm to about 1000 nm. Each of the OLED pixels in the array produces a different angle or view of a same image to form a 3D image.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

FIGS. 1E-1G illustrate different exemplary configurations of a 3D light field pixel from OLED pixels comprising a set of primary and/or non-primary color subpixels, according to various embodiments.

FIGS. 3A-3H illustrate various characteristics or aspects of exemplary nanorods of a metasurface, according to various embodiments.

FIGS. 3I-3K illustrate exemplary graphs of a phase profile of a metasurface, according to various embodiments.

FIGS. 4B-4C illustrate light field pixels, according to various embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
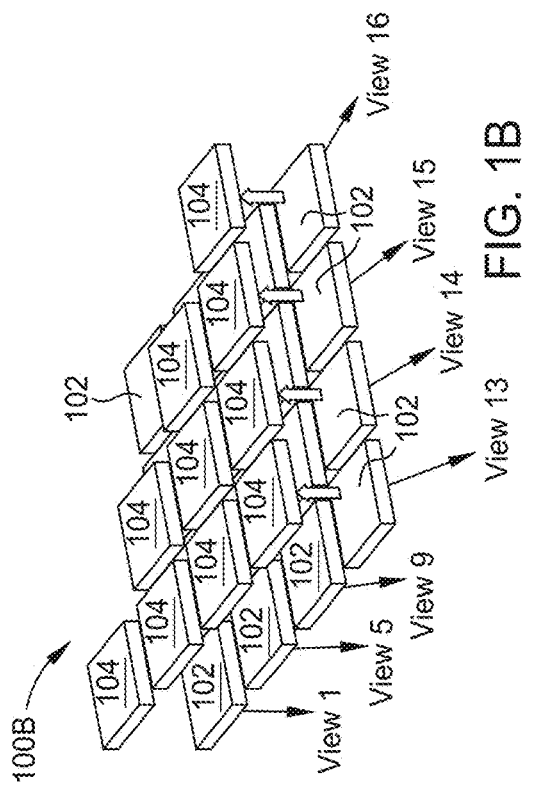
FIGS. 1A-1D illustrate a 3D light field pixel of a light field display for producing a 3D image, according to various embodiments.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure is generally related to 3D imaging capable OLED displays. A light field display comprises an array of 3D light field pixels, each of which comprises an array of corrugated OLED pixels, a metasurface layer disposed adjacent to the array of 3D light field pixels, and a plurality of median layers disposed between the metasurface layer and the array of corrugated OLED pixels. Each of the corrugated OLED pixels of the light field array comprises primary color subpixels, and produces a different angle or view of a 3D image through the median layers to the metasurface to form a 3D image. The corrugated OLED pixels combined with a cavity effect reduce a divergence of emitted light to enable effective beam direction manipulation by the metasurface. The metasurface components with higher refractive indices, a shorter period of building blocks, and a larger overall thickness enables the deflection and direction of the emitted light from the corrugated OLED pixels to be well controlled. The metasurface layer comprises multiple types and structures within each 3D light field pixel from the need to direct emission in the different views of a 3D image and to account for the wavelength effect of each primary and/or non-primary color.

FIGS. 1A-1D illustrate a light field pixel 100A-100D of a light field display for producing a 3D image, according to various embodiments. While one light field pixel is shown in FIGS. 1A-1D, a light field display comprises an array of light field pixels. Each light field pixel 100A-100D of FIGS. 1A-1D of a light field display comprises a plurality of OLED pixels 102 and a metasurface layer(s) 104. Each OLED pixel 102 is a self-emitting and high directivity light source, and each OLED pixel 102 comprises one or more sets of primary and/or non-primary color subpixels, such as one or more sets of red/green/blue (RGB) subpixels, or one or more sets of non-primary and/or non-primary color subpixels. For example, each OLED pixel 102 may comprise colors selected from the group consisting of red, green, yellow, blue, and white. The metasurface layer(s) 104 may be referred to as a beam manipulating element. The metasurface layer(s) 104 comprises multiple types and structures within each light field pixel 100A-100D from the need to direct emission in the different views of a 3D image and to account for the wavelength effect of each primary and/or non-primary color subpixel.

FIGS. 1E-1G illustrate a set of RGB subpixels 106, 108, 110 of the OLED pixels 102 utilized in the light field pixels 100A-100D of FIGS. 1A-1D, according to various embodiments. While RGB subpixels 106, 108, 110 are shown as an example of the primary and/or non-primary color subpixels, the light field display pixels 100A-100D, 103 are not limited to utilizing only RGB subpixels, as other primary and/or non-primary color subpixel combinations may be used. As shown in FIG. 1E, each OLED pixel 102 comprises at least one red subpixel 106, at least one green subpixel 108, and at least one blue subpixel 110. In some embodiments, like shown in FIG. 1F, each light field pixel 103 comprises a plurality of red subpixels 106, a plurality of green subpixels 108, and a plurality of blue subpixels 110. Thus, as used herein, an OLED pixel 102 comprises one or more sets of primary and/or non-primary color subpixels or RGB subpixels 106, 108, 110, and a light field display or single 3D light field pixel 103 comprises a plurality or grouping of OLED pixels 102.

The metasurface layer 104 of FIGS. 1A-1D may comprise multiple metasurface portions functioning as one surface, or the metasurface layer 104 may be a plurality of metasurface layers 104 where each metasurface layer of the plurality is aligned with an OLED pixel 102. In some embodiments, each metasurface layer of a plurality of metasurface layers 104 is aligned with a different RGB subpixel 106, 108, 110 of an OLED pixel 102 of the light field display 100A-100D due to wavelength effects. A metasurface layer 104 as used herein is a diffraction element comprising a plurality of nanorods or nanopegs in repeating or non-repeating units. The metasurface layer 104 enables the light field pixel 100A-100D, 103 to produce 3D images by controlling the diffraction angle and the direction of the emitted light from each OLED pixel 102.

In each light field pixel 100A-100D, the plurality of OLED pixels 102 are arranged in an array or matrix. For example, each light field pixel 100A-100D comprises 16 OLED pixels disposed in a matrix. However, each light field pixel 100A-100D may comprise any number of OLED pixels 102, such as 64 OLED pixels arranged in an 8×8 matrix, or 100 OLED pixels 102 arranged in a 10×10 matrix. Each OLED pixel 102 in the light field pixel 100A-100D outputs a different angular view of the same image to create a 3D projection. Moreover, while not shown in FIGS.

1A-1D, each light field pixel 100A-100D comprises a plurality of median layers disposed between the OLED pixels 102 and the metasurface layer 104. For example, the plurality of median layers may be a multi-layer structure, such as a thin film encapsulation (TFE) and one or more organic layers. The TFE may comprise a first dielectric layer, an organic layer, and a second dielectric layer. The first and second dielectric layers may each individually comprise SiNx, SiOx, SiOxNy, or AlxOy layers, where x and y are variables, etc., for example. The first and second dielectric layers may have a reflective index of about 1.8, and the organic layer may have a reflective index of about 1.5. Thus, the plurality of median layers form a stack of high and low reflective index layers.

As shown in FIG. 1G, each of the OLED pixels 102 of the light field pixels 100A-100D comprises at least one of a red subpixel 106, a green subpixel 108, and a blue subpixel 110. In such an embodiment, each RGB subpixel 106, 108, 110 of an OLED pixel 102 collectively produces one view 101 of the light field pixel 100A-100D. FIG. 1F illustrates an embodiment where each light field pixel 103 comprises a plurality of red subpixels 106, a plurality of green subpixels 108, and a plurality of blue subpixels 110. For example, the light field pixel 103 of FIG. 1G comprises a plurality of red subpixels 106 arranged in an array or matrix, a plurality of green subpixels 108 arranged in an array or matrix, and a plurality of blue subpixels 110 arranged in an array or matrix. In such an embodiment, one of each RGB subpixels 106, 108, 110 collectively produces one view 101 of the light field pixel 100A-100D. As noted above, while RGB subpixels 106, 108, 110 are shown as an example of the primary and/or non-primary color subpixels, the primary and/or non-primary color subpixels are not limited to being RGB subpixels, as other primary and/or non-primary color subpixel(s) may be used.

Figure 1B:
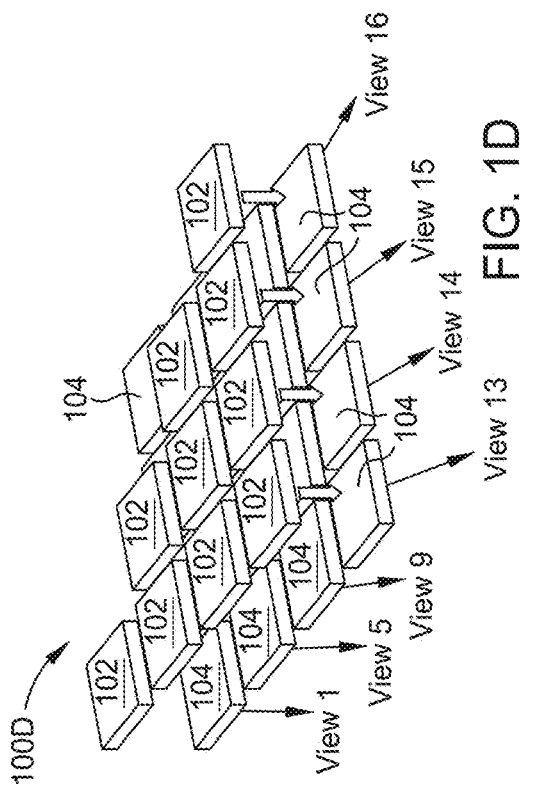

FIG. 1A illustrates a top emitting reflective light field pixel 100A. In the top emitting reflective light field pixel 100A, the OLED pixel 102 is disposed above (i.e., in the y-direction) the metasurface layer 104. The metasurface layer 104 is built into the bottom interface of the OLED pixel 102. The metasurface layer 104 provides the necessary reflectivity of the bottom interface and beam control capability to produce 3D images. FIG. 1B illustrates a bottom emitting reflective light field pixel 100B. In the bottom emitting reflective light field pixel 100B, the OLED pixel 102 is disposed below (i.e., in the −y-direction) the metasurface layer 104. The metasurface layer 104 is built into the upper interface of OLED pixel 102. The metasurface layer 104 provides the necessary reflectivity of the upper interface and beam control capability to produce 3D images.

In reflective light field pixels 100A, 100B, the metasurface layer 104 is disposed opposite to the direction of emission of the OLED pixel 102. Additionally, a plurality of median layers (not shown) are disposed between the metasurface layer 104 and the OLED pixel 102 in the light field pixels 100A, 100B. The median layers may be planar isolation layers commonly used in thin film transistor (TFT) processes.

Figure 1C:
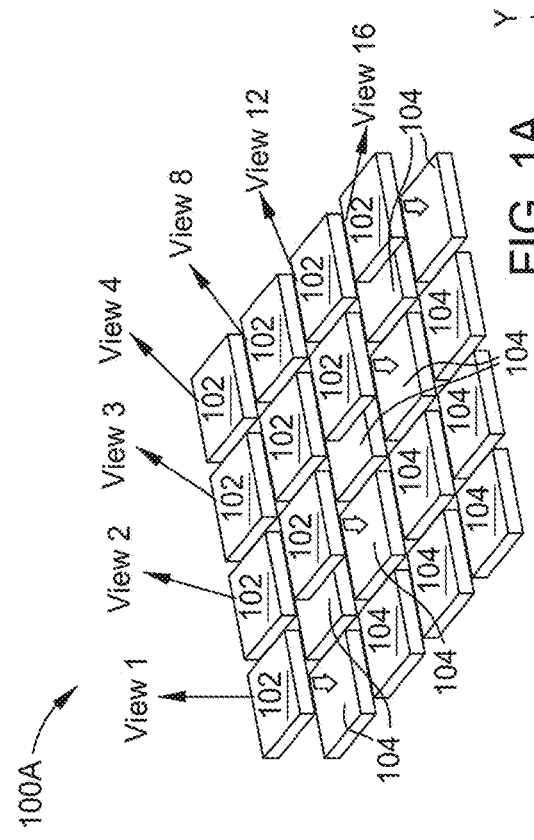
Figure 1D:
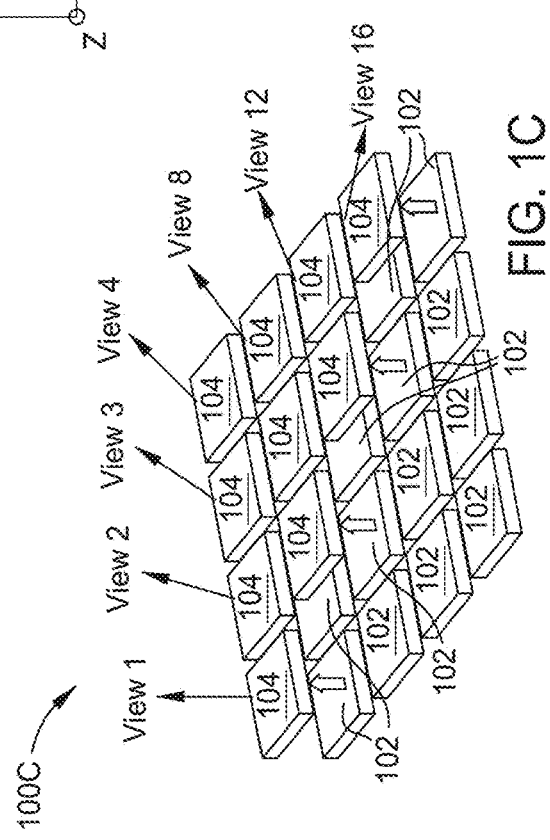

FIG. 1C illustrates a top emitting transmissive light field pixel 1000. In the top emitting transmissive light field pixel 1000, the OLED pixel 102 is disposed below (i.e., in the −y-direction) the metasurface layer 104. Light is emitted from each OLED pixel 102 up towards the metasurface 104, which then outputs the light to produce 3D images. FIG. 1D illustrates a bottom emitting transmissive light field pixel 100D. In the bottom emitting transmissive light field pixel 100D, the OLED pixel 102 is disposed above (i.e., in the y-direction) the metasurface layer 104. Light is emitted from each OLED pixel 102 down towards the metasurface layer 104, which then outputs the light to produce 3D images.

In transmissive light field pixels 1000, 100D, the metasurface layer 104 is disposed in the same direction as the emission of the OLED pixel 102. Additionally, a plurality of median layers (not shown) are disposed between the metasurface layer 104 and the OLED pixel 102 in the light field pixels 1000, 100D. The median layers may be thin film encapsulation (TFE) layers and organic layers.

In some embodiments, a light field display may comprise a combination of transmissive and reflective metasurface structures. For example, reflective mode metasurfaces may be implemented into a transmissive light field pixel, and vice versa.

Figure 2B:
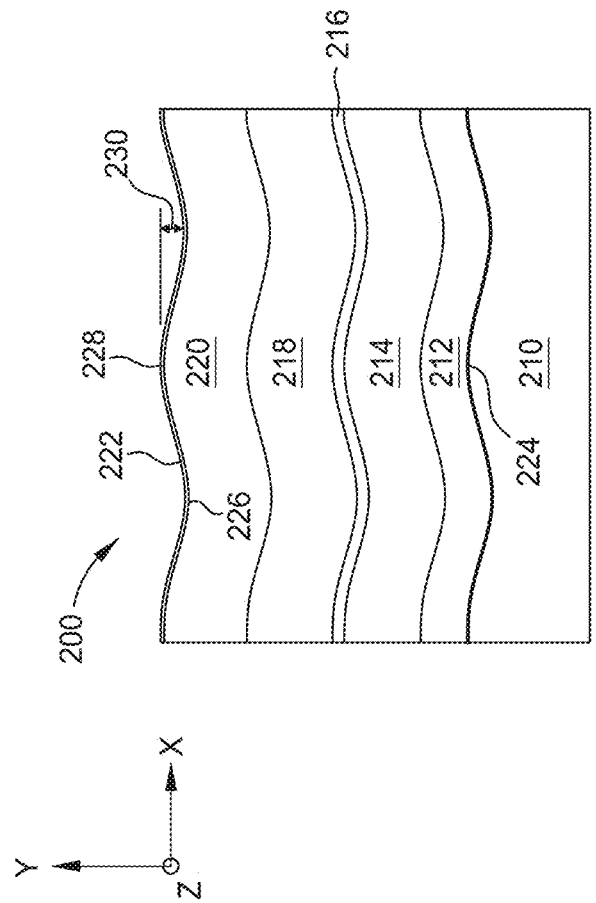
FIGS. 2A-2B illustrate layers of an OLED pixel, according to various embodiments.
Figure 2A:
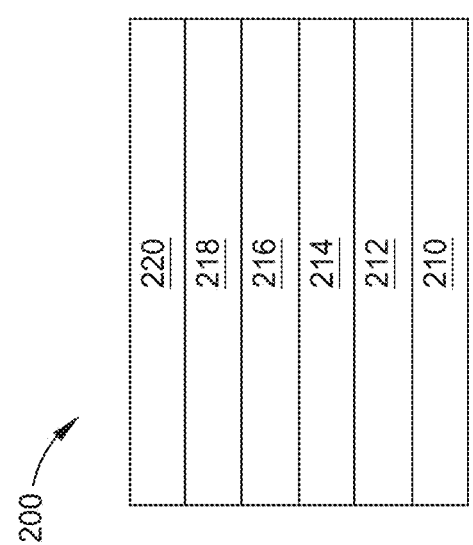

FIGS. 2A-2B illustrate the layers of an OLED pixel 200, according to various embodiments. The OLED pixel 200 may be the OLED pixels 102 of FIGS. 1A-1D. FIG. 2A illustrates a schematic cross-sectional view of the layers of the OLED pixel 200, and FIG. 2B illustrates the layers of the OLED pixel 200 having a corrugated surface 222. While the term OLED pixel is used herein, it is noted that the OLED pixel comprises one or more primary and/or non-primary color subpixels. For example, colors selected from the group consisting of red, green, yellow, blue, and white. As such, the term "OLED pixel" incorporates each primary and/or non-primary color subpixel individually, or a set of primary and/or non-primary color subpixels, and the description of the OLED pixel 200 below applies to each primary and/or non-primary color subpixel. For exemplary purposes, RGB subpixels will be used for the description of FIGS. 2A-2B. However, as noted above, the primary and/or non-primary color subpixels are not limited to being RGB subpixels.

In FIG. 2A, the OLED pixel 200 comprises a substrate 210, a bottom electrode layer 212, a top electrode layer 220, and one or more organic layers 214, 216, 218, according to one embodiment. The substrate 210 may comprise glass (rigid or flexible), plastic, metal foil, such as Al foil or Cu foil, a polymer, such as polyethylene terephthalate (PET), polyethylene naphthalate (PEN), and polyimide (PI), or a combination thereof. In some embodiments, the substrate 210 may include a plurality of device layers (e.g., buffer layers, interlayer dielectric layers, insulating layers, active layers, and electrode layers, as well as the elements of full display driving backplane circuits). For reflective type light field pixels, the device layers may be the median layers. The bottom electrode layer 212, which may be referred to as a conductive anode layer, may comprise indium tin oxide (ITO) and have a thickness in the y-direction of about 50 nm to about 200 nm, such as about 80 nm. Non-limiting examples of materials for the bottom electrode layer 212 include one or more oxides, one or more metals, one or more alloys of metals, or a combination thereof, such as Ag, Al, Mo, ITO, indium zinc oxide (IZO), fluorine-doped tin oxide (FTO), doped zinc oxide, or a combination thereof.

Non-limiting examples of materials for the top electrode layer 220 include one or more metals, one or more alloys of metals, one or more oxides, one or more transparent or semitransparent materials, or a combination thereof. For example, transparent conductive oxides, such as ITO or IZO, Ag, Al, Mo, FTO, doped zinc oxide, or a combination thereof can be used. The top electrode layer 220 may comprise a metal or a metal alloy, such as Al, Ag, or Mg:Ag. The top electrode layer 220 may have a thickness in the y-direction between about 10 nm to about 200 nm. For example, if a transparent conductive oxide (e.g., ITO) is utilized as the top electrode layer 220, the top electrode layer 220 may have a thickness in the y-direction between about 60 nm to about 200 nm, such as about 80 nm. If a metal or metal alloy (e.g., Mg:Ag) is utilized as the top electrode layer 220, the top electrode layer 220 may have a thickness in the y-direction between about 10 nm to about 30 nm, such as about 20 nm. Depending on whether the OLED pixel is bottom or top emitting, the bottom electrode layer 212 and top electrode layer 220 can be either reflective or transparent/semi-transparent.

The one or more organic layers 214-218 include a plurality of organic layers, such as a hole transport layer (HTL) 214, an emissive layer (EML) 216, and an electron transport (ETL) 218. However, the organic layers 214-218 are not limited to the illustrated embodiment. For example, in another embodiment, one or more additional layers, such as a hole injection layer (HIL) and an electron injection layer (EIL), may be added to the organic layers. For example, the HTL 214 may comprise NPB and have a thickness in the y-direction of about 50 nm to about 300 nm, such as about 120 nm, the EML 216 may comprise CBP and have a thickness in the y-direction of about 10 nm to about 30 nm, such as about 20 nm, and the ETL 218 may comprise TPBi and have a thickness in the y-direction of about 20 nm to about 300 nm, such as about 140 nm.

In some embodiments, the OLED pixel 200 may comprise a hexanitrile hexaazatriphenylene (HATCN) layer having a thickness of about 10 nm disposed on the bottom electrode layer, a first NPB layer disposed on the HATCN layer, a CBP:PtN$_7$N layer having a thickness of about 20 nm disposed on the first NPB layer, a TPBi layer disposed on the CBP:PtN$_7$N layer, a first LiF layer disposed on the TPBi layer, a Mg:Ag layer disposed on the first LiF layer, and a second NPB layer disposed on the Mg:Ag layer. The LiF layers may have a refractive index of about 1.3, and the NPB layers may have a refractive index of about 1.8.

The OLED pixel 200 may comprise a TFE or multilayer structure disposed on the top electrode layer 220. For example, the plurality of median layers may be a multi-layer structure, such as a TFE and one or more organic layers. The TFE may comprise a first dielectric layer, an organic layer, and a second dielectric layer. The first and second dielectric layers may each individually comprise SiNx, SiOx, SiOxNy, AlxOy, where x and y are variables, etc., for example. The first and second dielectric layers may have a reflective index of about 1.8, and the organic layer may have a reflective index of about 1.5. Thus, the plurality of median layers may form a stack of high and low reflective index layers.

In order to have more energy distributed into waveguided mode, the total thickness of the organic layers 214-218 may be larger than about 200 nm. In addition, the distance from the EML 216 to any metal interface should be larger than about 100 nm to avoid surface plasmon loss. With the OLED pixel 200 having such a cavity condition, the power distribution of light will have a larger portion in the waveguided mode. A dominating single waveguide mode can lead to high directional light with the aid of an extraction structure, such as the corrugation structure of the OLED pixel 200.

FIG. 2B illustrates the OLED pixel 200 having a corrugated surface 222. In some embodiments, such as transmissive top emitting and reflective bottom emitting pixels, the corrugated surface 222 is disposed adjacent to a plurality of median layers, the plurality of median layers being disposed adjacent to a metasurface, such as the metasurface layer 104 of FIGS. 1A-1D. In other embodiments, such as reflective top emitting pixels and transmissive bottom emitting pixels, the plurality of median layers are disposed above the corrugated surface 224 of the substrate 210, where the metasurface is disposed below OLED pixel 200 adjacent to the substrate 210. Such embodiments are shown and described further below with regard to FIGS. 4B-4C.

In one embodiment, a surface 224 of the substrate 210 disposed in contact with the bottom electrode layer 212 has a corrugated surface which translates or propagates through each layer 212-220 of the OLED pixel 200. In other embodiments, the surface 224 of the substrate 210 may be flat or planar while one or more other layers 212-220 of the OLED pixel 200 are corrugated to result in the corrugated surface 222. The corrugated surface 222 may have a corrugation period of about 100 nm to about 1000 nm, such as about 200 nm to about 500 nm. The corrugation height 230 in the y-direction from a point on the bottom of a valley 226 to a point at the top of an adjacent peak 228 may be about 5 nm to about 500 nm, such as about 10 nm to about 100 nm. The corrugated surface 222 of the OLED pixel 200 combined with a cavity effect reduces divergence of emitted light, resulting in smaller divergence angles. The corrugated surface 222 is a 2D structure, where the surface extends in the x-direction and the y-direction. The corrugation height 230 of the corrugated surface 222 extends in the y-direction, thus providing the third dimension for the corrugated surface 222.

Figure 3D:
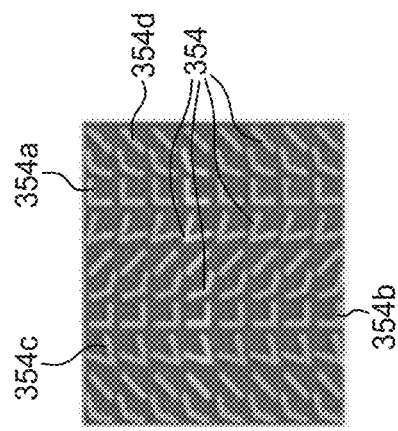

FIGS. 3A-3H illustrate various characteristics or aspects of nanorods or nanopegs of a metasurface, according to various embodiments. The metasurface may be the metasurface layer 104 of FIGS. 1A-1D. FIGS. 3A-3G illustrates various non-limiting shapes of the nanorods of a metasurface, and FIG. 3H illustrates the spacing between a plurality of nanorods of a metasurface. Moreover, FIGS. 3A-3H are intended to be examples, and the nanorods utilized are not limited to the shapes and characteristics described herein. While the term "nanorod" is used herein, the term is not intended to be limiting, as the nanorods or nanopegs are not limited to having a rod-like shape.

As shown in the top view and the side view of FIG. 3A, each nanorod of the metasurface may have a circular shape 340, a square shape 342, a triangular shape 344, or a hexagonal shape 346, among others. The nanorods are not limited to having any particular shape, and the shapes shown in FIG. 3A are for exemplary purposes only. Moreover, a metasurface may comprise one or more nanorods having different shapes (e.g., a metasurface comprising circular shaped 340 nanorods and triangular shaped 344 nanorods), like shown in FIGS. 3C-3D. The plurality of nanorods of the metasurface may further be in repeating units or non-repeating units. A metasurface filler is disposed around and on the plurality of nanorods, as discussed further below in FIGS. 4B-4C. The plurality of nanorods comprises a material having a refractive index larger than the refractive index of the metasurface filler by at least 0.5.

Figure 3G:
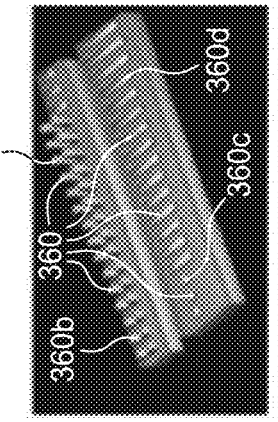
Figure 3C:
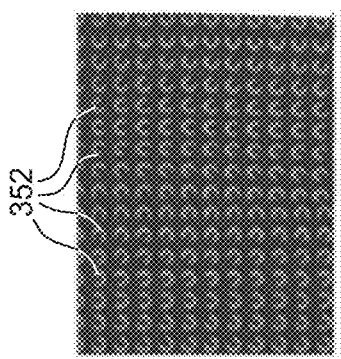
Figure 3F:
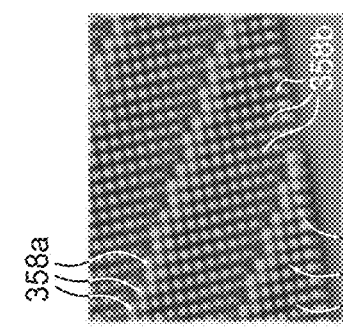
Figure 3B:
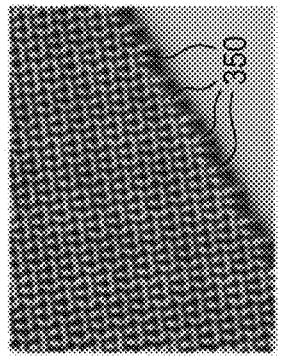

In FIG. 3B, each nanorod 350 has a substantially rectangular shape, where each nanorod 350 may be rotated such that one or more nanorods 350 has a different rotation than one or more other nanorods 350 (i.e., one or more nanorods being disposed at various angles). In FIG. 3C, each nanorod 352 has a semi-circular or horseshoe-like shape. Similar to FIG. 3B, one or more nanorods 352 of FIG. 3C may be rotated with respect to one or more other nanorods 352. FIG. 3D illustrates an embodiment where one or more nanorods 354 may have both a different shape and/or a different rotation with respect to one or more other nanorods 354. For example, as shown in FIG. 3D, one or more nanorods 354a, 354b has an L-like shape, one or more nanorods 354c has a V-like shape, and one or more nanorods 354d has a rectangular shape. Furthermore, the nanorods 354 may have different rotations. For example, the one or more nanorods 354a, 354b having an L-like shape may have different rotations from one another, where one or more nanorods 354a has an upright L-like shape and one or more nanorods 354b has an upside down L-like shape.

Figure 3E:
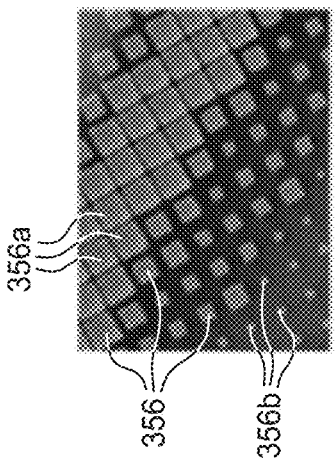

FIGS. 3E-3F illustrate embodiments where the plurality of nanorods 356, 358, respectively, have different sizes, resulting in the fill factor or duty cycle of the nanorods 356, 358 being different. For example, in FIG. 3E, one or more first nanorods 356a have a first size and are spaced a first distance apart, and one or more second nanorods 356b have a second size smaller than the first size and are spaced a second distance apart greater than the first distance. In FIG. 3E, each of the nanorods 356 has a substantially square shape. Similarly, in FIG. 3F, one or more first nanorods 358a have a first size and are spaced a first distance apart, and one or more second nanorods 358b have a second size smaller than the first size and are spaced a second distance apart greater than the first distance. In FIG. 3F, each of the nanorods 358 has a substantially circular shape.

FIG. 3G illustrates an embodiment where the plurality of nanorods 360 has different shapes and/or heights, resulting in the fill factor or duty cycle of the nanorods 360 being different. For example, one or more first nanorods 360a has a first shape and a first height, and one or more second nanorods 360b has a second shape and a second height. While the first and second shapes of the first and second nanorods 360a, 360b may be the same, the first height of the first nanorods 360a is greater than the second height of the second nanorods 360b. Similarly, one or more third nanorods 360c has a third shape, and one or more fourth nanorods 360d has a fourth shape. While the heights of the third and fourth nanorods 360c, 360d may be the same, the third nanorods 360c have a square shape while the fourth nanorods 360d have a rectangular shape (i.e., larger than the third nanorods 360c). Moreover, the first, second, third, and/or fourth nanorods 360a-360d may all have different heights and/or shapes from one another.

FIG. 3H illustrates a side view of three nanorods 332, 334, 336 of a metasurface. While three nanorods 332, 334, 336 are shown for exemplary purposes, a metasurface comprises a plurality of nanorods, and may include more than three nanorods. In some embodiments, each individual nanorod 332, 334, 336 has a duty cycle 338 between about 10% to about 90%. The width of the nanorods 332-336 helps define a filling factor of the metasurface, or a ratio of the size of the OLED pixel to the metasurface, which affects the optical properties of the metasurface, as discussed further below in FIGS. 3I-3K. The nanorods 332, 334, 336 may have a pitch 348 between about ½λ to about 2λ, where λ is the wavelength of the incoming primary and/or non-primary color subpixel. The pitch 348 is defined from a first surface 332a of a first nanorod 332 to a first surface 334a of an adjacent nanorod 334. Each nanorod 332-336 may have a height of about 100 nm or greater. As shown in FIG. 3H, the height of a nanorod 336 is defined from a first surface 336a disposed adjacent to the OLED pixel to a second surface 336b disposed opposite the first surface 336a.

By controlling the shape, pitch, height, and index of refraction of the nanorods of the metasurface, the metasurface is able to control the diffraction angle and direction of emitted light. However, the metasurface is wavelength dependent, and thus, the characteristics may vary based on the wavelength of the light emitted from the OLED pixels. Generally, the shorter the wavelength of the emitted light, the larger the deflection angle of the metasurface. As such, the metasurface having components with higher refractive indices, a shorter period of building blocks, and a larger overall thickness results in a greater deflection and direction of emitted light.

FIGS. 3I-3K illustrate graphs 370, 380, 390 of how the physical structure of a metasurface is determined from a desired phase profile of a metasurface which achieves the desired deflection or angle of emission, according to various embodiments. FIG. 3I illustrates the target phase profile to achieve a desired deflection or angle of emission. The graph 370 of FIG. 3I shows an electromagnetic phase versus a position on the metasurface. FIG. 3J illustrates a graph 380 of an electromagnetic phase versus a filling factor of the nanorods on the metasurface. FIG. 3K illustrates a graph 390 showing the filling factor of the nanorods on the metasurface versus a position on the metasurface to achieve the target phase profile.

The above-described characteristics of the metasurface allows emitted light from OLED pixels and primary and/or non-primary color subpixels to be deflected in a desired angle and direction. As such, the metasurface enables the light field pixel/display to create different views for a given 3D image.

Figure 4A:
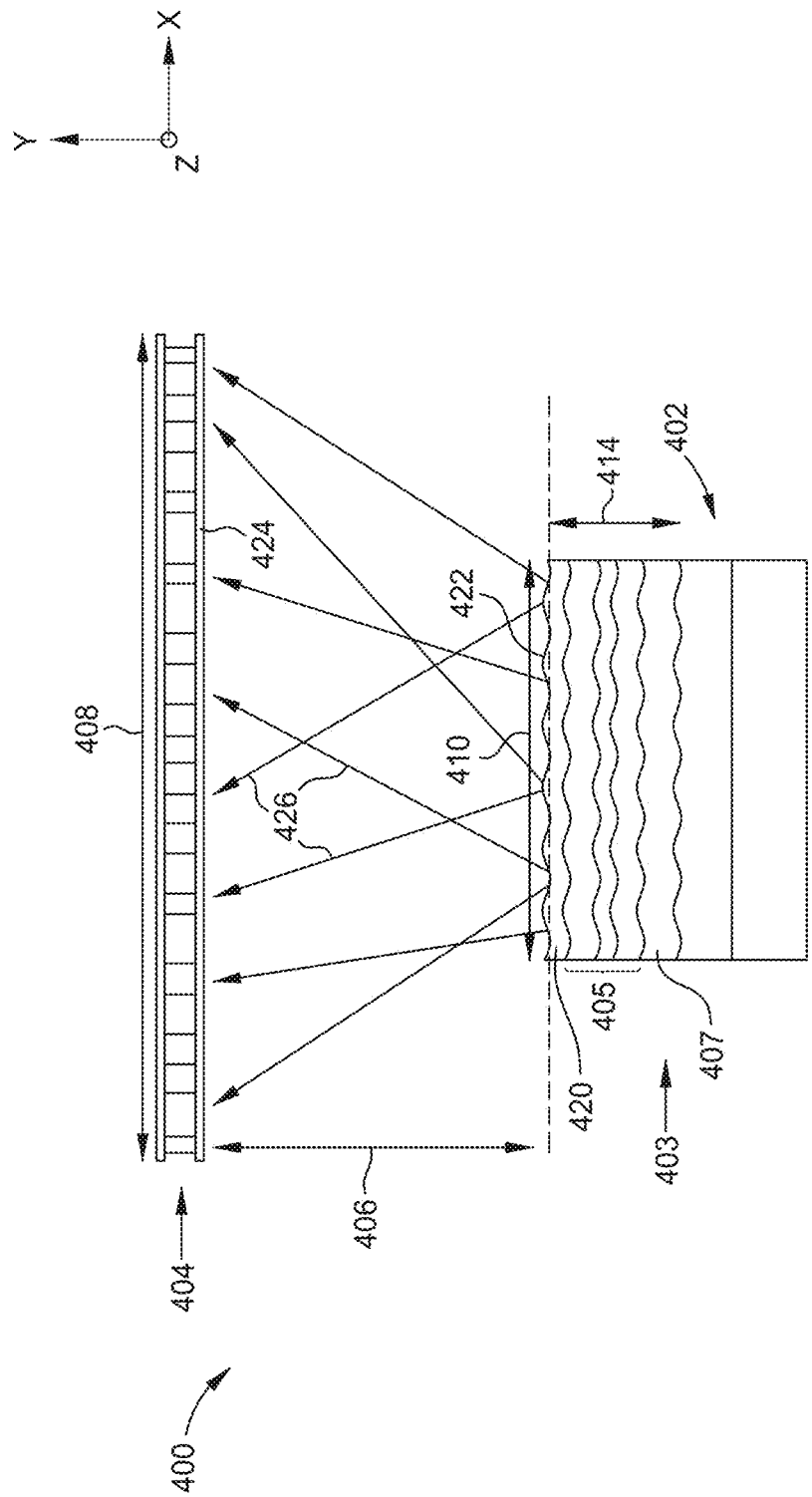
FIG. 4A illustrates one primary and/or non-primary color subpixel of an OLED pixel of a light field display, according to various embodiments.

FIG. 4A illustrates one primary and/or non-primary color subpixel 403 of an OLED pixel 402 of a light field pixel 400, according to one embodiment. FIG. 4B illustrates a top transmission light field pixel 430, according to one embodiment. FIG. 4C illustrates a top reflective light field pixel 450, according to another embodiment. The light field pixels 400, 430, 450 are examples of light field pixels that may be utilized, and any of the light field pixels 100A-100D of FIGS. 1A-1D may be used as well. A light field display comprises a plurality of light field pixels 400, 430, 450. Thus, as used herein, the term "light field display" incorporates a plurality of light field pixels 400, 430, 450, and the terms "light field display" and "light field pixel" may be referred to interchangeably.

The light field pixel 400 of FIG. 4A may be a top emitting reflective, a bottom emitting reflective, a top emitting transmissive, or a bottom emitting transmissive light field pixel or display. The primary and/or non-primary color subpixel 403 may be one of a red subpixel, a green subpixel, or a blue subpixel, for example, such as the red subpixel 106, the green subpixel 108, or the blue subpixel 110 of FIG. 1E. In other embodiments, the primary and/or non-primary color subpixel may be one of a yellow subpixel, an orange subpixel, or a white subpixel. As noted above, while RGB subpixels are referred to as an example of the primary and/or non-primary color subpixels, the primary and/or non-primary color subpixels are not limited to being RGB subpixels, as other primary and/or non-primary color subpixel(s) may be used.

The light field pixel/display 400 comprises a plurality of OLED pixels 402, a plurality of sets of primary and/or non-primary color subpixels (only one subpixel shown for exemplary purposes), a plurality of median layers (not shown), and one or more metasurfaces 404 (only one shown). As noted above, each primary and/or non-primary color subpixel of each of the OLED pixels 402 may have a different metasurface, and each primary and/or non-primary color subpixel 403 and/or OLED pixel 402 in the light field pixel/display 400 outputs the same image at a different view or angle to create a 3D projection. The OLED pixels 402 may be the OLED pixel 200 of FIG. 2A-2B, and the metasurface 404 have one or more of the characteristics or aspects described in FIGS. 3A-3B.

While not shown in FIG. 4A, a plurality of median layers are disposed between the primary and/or non-primary color subpixel 403 and the metasurface 404. The median layer contacting the OLED pixel may comprise a material having a refractive index smaller than the refractive index of the organic layers 405 and the transparent/semi-transparent layer 420 by at least 0.2, as discussed below in FIG. 4B. For example, the plurality of median layers may be a multi-layer structure, such as a TFE, as discussed above. The TFE may comprise one or more high and low refractive index buffer layers. To meet the target, the TFE layer contacting the OLED pixel should possess a refractive index smaller than the organic layers 405 and the transparent/semi-transparent layer 420 by about 0.2, or an additional low refractive index layer may be inserted between the OLED pixel and the TFE.

A corrugated surface 422 of the primary and/or non-primary color subpixel 403 is spaced a first distance 406 in the y-direction from a bottom surface 424 of the metasurface 404 of about 5 µm to about 100 µm. In the example light field pixel/display 400, the first distance 406 is about 10 µm. The first distance 406 may be a thickness of the median layers. The metasurface 404 has a width 408 in the x-direction between about 1 µm to about 500 µm, such as about 12 µm, and the primary and/or non-primary color subpixel 403 has a width 410 in the x-direction between about 0.5 µm to about 250 µm, such as about 6 µm. The primary and/or non-primary color subpixel 403 further has a cavity 414 defined from a reflective layer 407 to a top transparent/semi-transparent layer 420. The cavity 414 may have a size greater than about 200 nm to enable more waveguide power distribution. The reflective layer 407 may comprise Ag, ITO/Ag/ITO, or other high reflectivity material, and the top transparent/semi-transparent layer 420 may comprise Ag, Ag:Mg, ITO, IZO, or any conductive and transparent/semi-transparent material combination. The spacing of the cavity 414 and the corrugated surface 422 help control the wavelength, power distribution, and divergence of the emitted light, enabling the metasurface 404 to control the deflection and direction of the emitted light. As shown in FIG. 4A, the metasurface 404 has a width 408 greater than a width 410 of the primary and/or non-primary color subpixel 403.

As light beams 426 are emitted from the primary and/or non-primary color subpixel 403, the light beams 426 exit the corrugated surface 422 at different angles through the median layer towards the metasurface 404. To achieve a glass-free autostereoscopic effect while avoiding inter-view crosstalk, different views should be output and formed at both eyes of a viewer. For example, assuming the average spacing between human eyes is about 6.3 cm and the general stereo distance is about 30 cm, the angular separation between views (Ae) is approximately 10° for a 64-view light field display. Table 1 below illustrates various exemplary requirements for creating a 3D light field display, such as the light field display 400.

TABLE 1

| Number of pixels in matrix | 8*8 = 64 views | 4*4 = 16 views |
|---|---|---|
| FOV (field of view) | 90° | |
| Subpixel size (metasurface) | 12 µm | 24 µm |
| Angular separation between views | ~10° | ~20° |
| Divergence of each beam in FWHM @air | ~10° (±5°) | ~20° (±10°) |
| @ n = 1.5 | ~6.6° (±3.3°) | ~13.3° (±6.6°) |

As shown in Table 1, in a light field display comprising 64 views (i.e., an 8×8 matrix), the angular separation between views is about 10°. In a light field display comprising 16 views (i.e., a 4×4 matrix), the angular separation between views is about 20°. As further shown in Table 1, in a light field display comprising 64 views, the divergence measured in FWHM of each beam is about 10° (±5°) in air and about 6.6° (±3.3°) in a plurality of median layers having a refractive index of about 1.5. In a light field display comprising 16 views, the divergence of each beam is about 20° (±10°) in air and about 13.3° (±6.6°) in a plurality of median layers having a refractive index of about 1.5.

To effectively control the beam direction utilizing the metasurface, the metasurface should receive incident light with a narrow emission profile. To realize this, an OLED with smaller divergence angle is needed. A source of about 10° FWHM is sufficient to achieve such a narrow emission profile while maintaining the efficiency. For a less divergent OLED source, the distance between the light source and metasurface can be increased to cutoff a light having a large incident angle, sacrificing efficiency for a narrow emission profile.

Figure 5A:
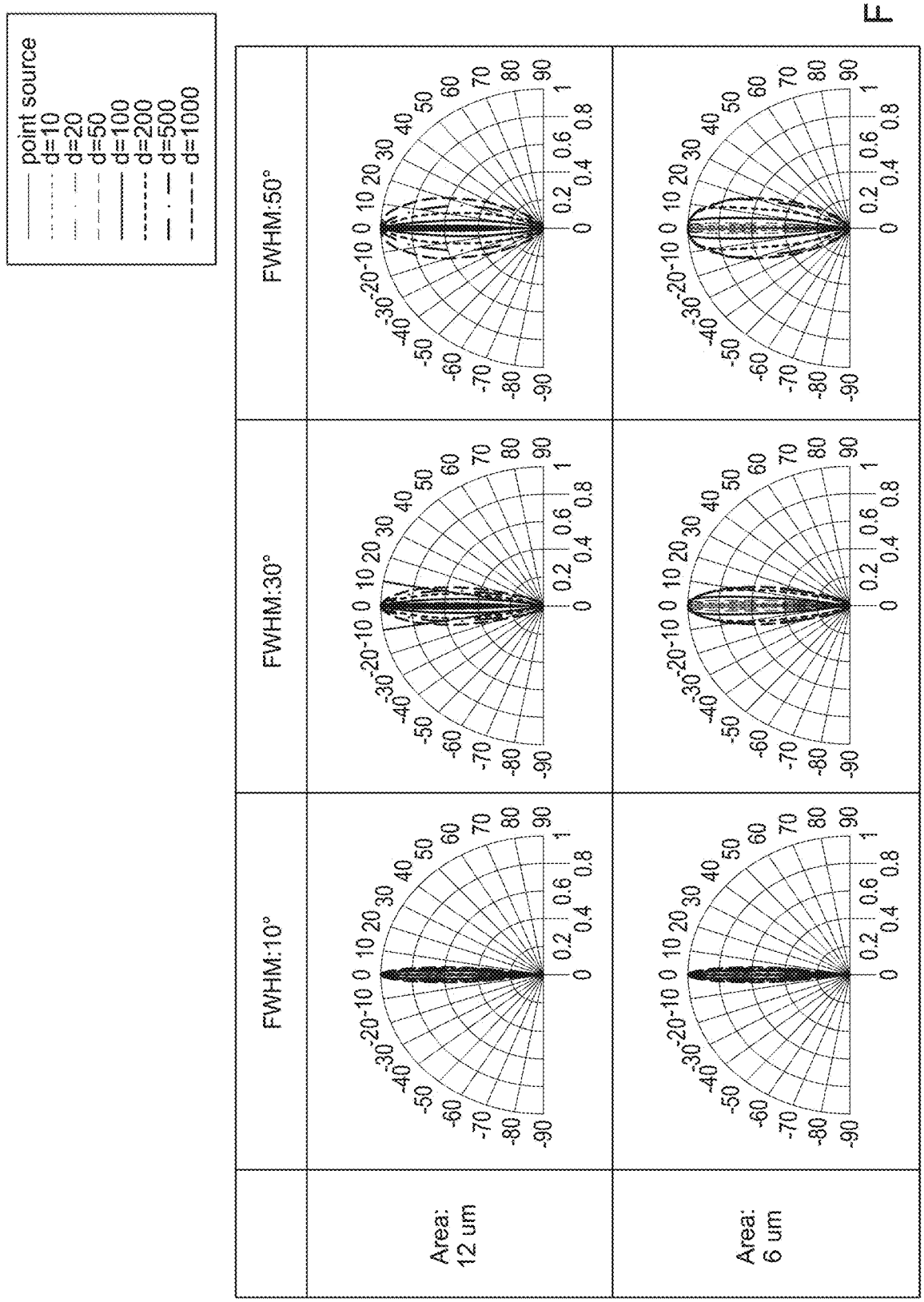
FIG. 5A illustrates exemplary emission profiles with respect to the emission divergence of each beam in FWHM and the distance between the OLED pixel and the metasurface, according to various embodiments.
Figure 5B:
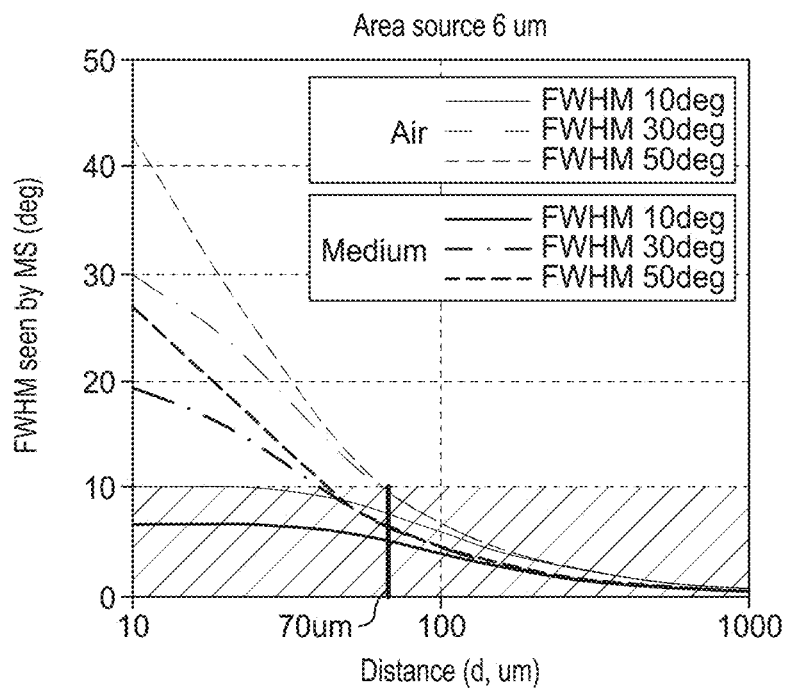
FIGS. 5B-5C illustrate exemplary divergence of each beam seen by the metasurface with respect to the FWHM of each beam and the distance between the OLED pixel and the metasurface, according to various embodiments.
Figure 5C:
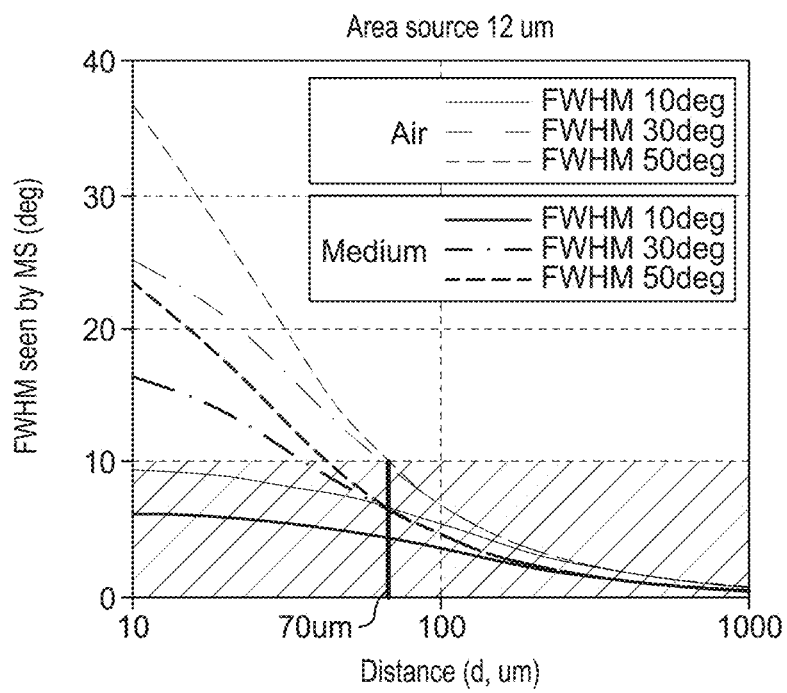

FIG. 5A illustrates exemplary emission profiles with respect to the area source with different divergences of each beam and the distance between each primary and/or non-primary color subpixel of the OLED pixel and the metasurface (e.g., a total thickness of the median layers), such as the primary and/or non-primary color subpixel 403, the OLED pixel 402, and the metasurface 404 of the light field pixel/display 400 of FIG. 4A, according to various embodiments. In FIG. 5A, the "FWHM" in the columns are representing the width of the emission profile, which are measured in an angle difference of 50% intensity. FIGS. 5B-5C illustrate exemplary divergence of FWHM of each beam seen by the metasurface at a wavelength between about 490 nm to about 530 nm with respect to the distance between the primary and/or non-primary color subpixel and the metasurface, such as the primary and/or non-primary color subpixel 403, the OLED pixel 402, and the metasurface 404 of the light field pixel/display 400 of FIG. 4A, according to various embodiments.

Figure 5D:
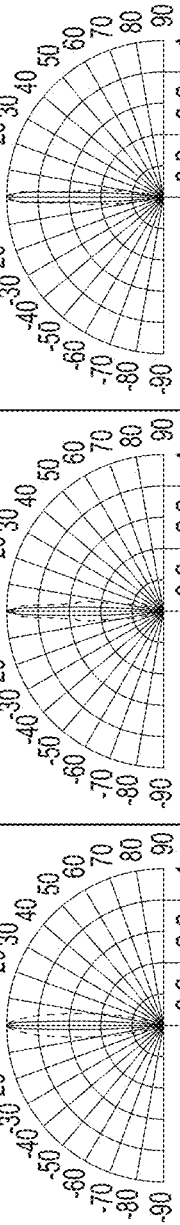
FIG. 5D illustrates exemplary phase profile optimization with different OLED pixel widths and distance between the OLED pixel and the metasurface, according to various embodiments.

As can be observed from the FIGS. 5A-5C, a narrower emission profile can be obtained by increasing the distance between the light source and the metasurface. FIG. 5D is an example of an optimized phase profile versus different OLED pixel widths and distances between the OLED pixel and the metasurface, according to various embodiments. In FIG. 5D, line 510 is the target output and line 520 is the optimized result. As shown in FIG. 5D, a better phase profile optimization can be obtained with a smaller OLED pixel against a metasurface and with increased distance between the OLED pixel and the metasurface.

Although a narrow emission profile can be obtained by increasing the distance between the OLED pixel and the metasurface, such a configuration sacrifices a lot of efficiency since the light having a large incident angle is cutoff. To avoid this disadvantage, the corrugated OLED pixel is introduced as an alternative approach.

For example, referring back to FIG. 4A, the corrugated surface 422 of the primary and/or non-primary color subpixel 403 combined with the cavity effect reduces divergence of emitted light, resulting in smaller divergence angles. In wavevector space ($\vec{k}$ space), the high directional OLED pixel results in most of its radiation being distributed around the $k_z$ axis. That is to say, the in-plane wavevector $\vec{k}_{//}$ ($\vec{k}_{//}^2 = \vec{k}^2 - \vec{k}_z^2$) is close to zero. In photonic crystal theory, a periodic structure could extract waveguide modes and SPP modes by $\vec{K}$ shifting. Herein, $\vec{k'}_{//} = \vec{k}_{//} \pm n \cdot \vec{K}$, $\vec{K} = 2\pi/\Lambda$, where $\Lambda$ is the structure's period. Thus, $\vec{k'}_{//} = \vec{k}_{//} - \vec{K} = 0$, and $\Lambda = 2\pi/\vec{k}_{//} = \lambda_{//}$. From above, a high waveguided planar OLED pixel is chosen by design, and the OLED cavity can properly adopt periodic structures like corrugation to create a high directional OLED pixel.

The metasurface 404 having the characteristics described in FIGS. 3A-3K allows emitted light from the primary and/or non-primary color subpixels 403 of each OLED pixel 402 to be deflected in a desired angle and direction. For example, the metasurface having components with higher refractive indices, a shorter period of building blocks, and a larger overall thickness results in a greater deflection and direction of emitted light. As such, the metasurface 404 and the primary and/or non-primary color subpixels 403 of the OLED pixels 402 having the corrugated surface 422 enables the light field display 400 to create different views and angles for a given 3D image with little to no crosstalk between light field views.

FIG. 4B illustrates a top transmission light field pixel 430, according to one embodiment. FIG. 4C illustrates a top reflective light field pixel 450, according to another embodiment. The light field pixels 430, 450 of FIGS. 4A and 4B may be the light field pixel 400 of FIG. 4A.

The top transmission light field pixel 430 of FIG. 4B comprises a dielectric or organic layer 442, a corrugated OLED pixel 402 disposed on the dielectric or organic layer 442, a plurality of median layers 434 disposed on the corrugated OLED pixel 402, and a metasurface 404 disposed on the plurality of median layers 434. As shown, the plurality of median layers 434 comprise a first median layer 434a, a second median layer 434b, a third median layer 434c, and a fourth median layer 434d. However, the number of median layers 434 shown is not intended to be limiting, and a greater or lesser number of median layers 434 may be included. In some embodiments, the plurality of median layers 434 may be a multi-layer structure comprising a thin film encapsulation (TFE) and one or more organic layers. For example, the TFE may comprise a low refractive index layer 434a, a first dielectric layer 434b, an organic layer 434c, and a second dielectric layer 434d. The first and second dielectric layers may each individually comprise SiNx, SiOx, SiOxNy, AlxOy layers, where x and y are variables, etc., for example.

The top reflective light field pixel 450 of FIG. 4C comprises a dielectric or organic layer 442, a metasurface 404 disposed on the dielectric or organic layer 442, a plurality of median layers 454 disposed on the metasurface 404, a corrugated OLED pixel 402 disposed on the plurality of median layers 454, and one or more functional layers 456 disposed on the corrugated OLED pixel 402. The metasurface 404 may be reflective, and a bottom layer of the corrugated OLED pixel 402 in contact with the metasurface filler 448 may be transparent. As shown, the plurality of median layers 454 comprises a first median layer 454a, a second median layer 454b, a third median layer 454c, and a fourth median layer 454d. However, the number of median layers 454 shown is not intended to be limiting, and a greater or lesser number of median layers 454 may be included. The plurality of median layers 454 may comprise the same materials as the plurality of median layers 434 of FIG. 4B. In some embodiments, the plurality of median layers 454 may be a plurality of device layers, such as buffer layers, interlayer dielectric layers, insulating layers, active layers, and electrode layers, as well as the elements of full display driving backplane circuits. In some embodiments, the one or more functional layers 456 can be a multi-layer structure comprising a thin film encapsulation (TFE) and one or more organic layers, as described above. While one functional layer 456 is shown, more than one functional layer 456 may be included.

In the top transmission light field pixel 430 of FIG. 4B and the top reflective light field pixel 450 of FIG. 4C, the metasurface 404 comprises a metasurface layer 444, a plurality of nanorods 446, such as the nanorods discussed in FIGS. 3A-3H, and a metasurface filler 448 disposed on and in between the plurality of nanorods 446. The metasurface filler 448 may comprise an organic material, such as optically clear adhesives, a polymer, a dielectric material, such as $SiO_2$, or air, as air has a low refractive index.

In the top transmission light field pixel 430 of FIG. 4B and the top reflective light field pixel 450 of FIG. 4C, the layers in contact with the corrugated OLED pixel 402 have lower refractive indices than the corrugated OLED pixel 402 by at least 0.2. Thus, in the top transmission light field pixel 430 of FIG. 4B, the dielectric or organic layer 442 and the first median layer 434a have lower refractive indices than the corrugated OLED pixel 402 by at least 0.2. Similarly, in the top reflective light field pixel 450 of FIG. 4C, the functional layer 456 and the fourth median layer 454d have lower refractive indices than the corrugated OLED pixel 402 by at least 0.2.

Moreover, in the top transmission light field pixel 430 of FIG. 4B and the top reflective light field pixel 450 of FIG. 4C, the deflection of emitted light by the plurality of nanorods 446 is defined by the refractive index difference between the nanorods 446 and the metasurface filler 448. As such, the plurality of nanorods 446 have a higher refractive index than the metasurface filler 448 by at least 0.5.

Figure 6B:
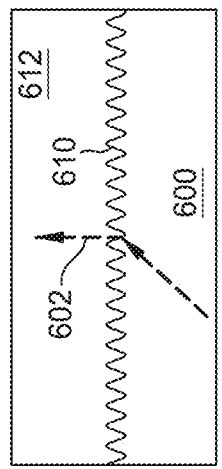
FIGS. 6A-6B illustrate a high waveguided OLED pixel having a corrugated surface, according to various embodiments.
Figure 6A:
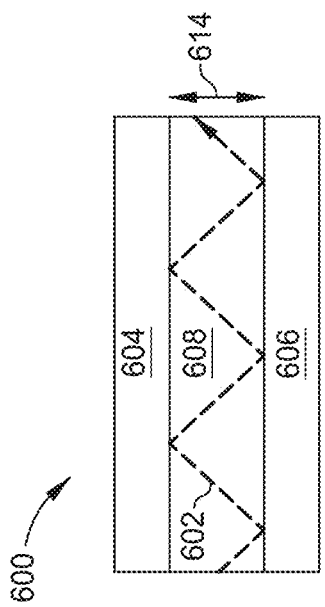

FIGS. 6A-6B illustrate a high waveguided primary and/or non-primary color subpixel 600 of an OLED pixel having a corrugated surface, according to various embodiments. The OLED pixel comprising the primary and/or non-primary color subpixel 600 may be the OLED pixel 102 of FIGS. 1A-1D, the OLED pixel 200 of FIGS. 2A-2B, and/or the OLED pixel 402 of FIG. 4A-4C. The primary and/or non-primary color subpixel 600 may be one of a red subpixel, a green subpixel, or a blue subpixel, for example, such as the red subpixel 106, the green subpixel 108, or the blue subpixel 110 of FIG. 1E.

FIG. 6A illustrates the waveguide mode 602 of emitted light within a cavity 614 comprising the organic layers 608 of the primary and/or non-primary color subpixel 600. The cavity 614 may be the cavity 414 of FIG. 4A. The waveguide mode 602 of the primary and/or non-primary color subpixel 600 occurs between the bottom electrode layer 606 and a top electrode layer 604. To obtain waveguide mode effectively, the layers adjacent to the bottom electrode layer 606 and the top electrode layer 604 have refractive indices smaller than the organic layers 608, the bottom electrode layer 606, and the top electrode layer 604 by at least 0.2, respectively. The top electrode layer 604 may be the top transparent/semi-transparent layer 420 of FIG. 4A or the top electrode layer 220 of FIGS. 2A-2B. FIG. 6B illustrates the light of the waveguide mode 602 being diffracted by the corrugated grating 610 of the primary and/or non-primary color subpixel 600 to 0° in the median layer 612. The waveguide mode 602 and the corrugated grating 610 of the primary and/or non-primary color subpixel 600 enable the primary and/or non-primary color subpixel 600 to emit highly directional light.

Figure 6C:
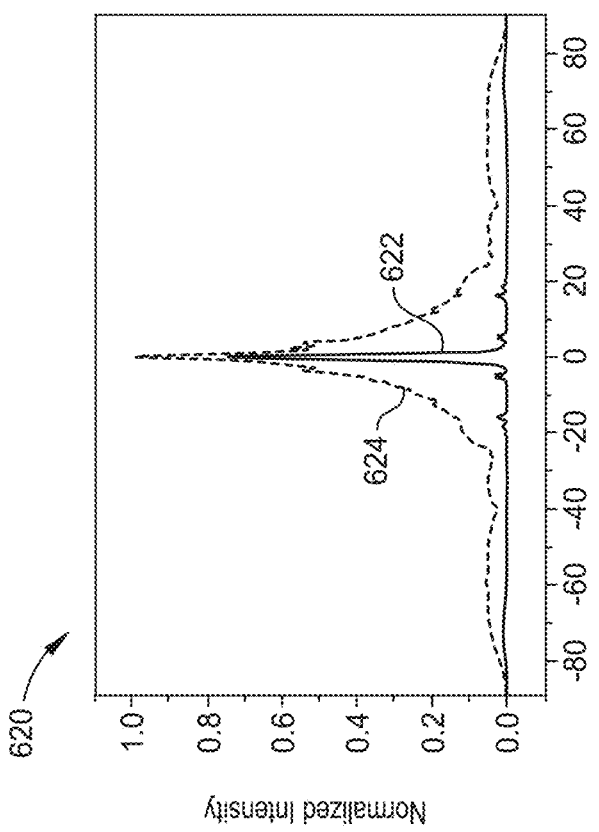
FIG. 6C illustrates a graph of normalized emission intensity of a corrugated OLED pixel versus the light angle in degrees to illustrate the wavelength effect, according to various embodiments.

FIG. 6C illustrates a graph 620 of normalized intensity of the output light field of a corrugated primary and/or non-primary color subpixel of an OLED pixel versus the light angle in degrees, according to various embodiments. In FIG.

6C, the first line 622 shows the output light field of the corrugated primary and/or non-primary color subpixel under a monochromatic case at a wavelength of about 520 nm. The second line 624 shows a chromatic case where the wavelength is weighted from about 500 nm to about 600 nm. In the chromatic case shown by second line 624, the divergence measured in FWHM is between about 6° to about 9°, such as about 7.65° (±3.83°).

The cavity 614, and thus the cavity effect, is adjusted to create a beam of narrower FWHM in order to reduce the wavelength dependent divergence. As such, most of the emitted light is confined to the waveguide mode, which traps the light within the primary and/or non-primary color pixel. By the assistance of the corrugated surface of the primary and/or non-primary color pixel, the once trapped light can be extracted externally in a highly directional manner.

Figure 7:
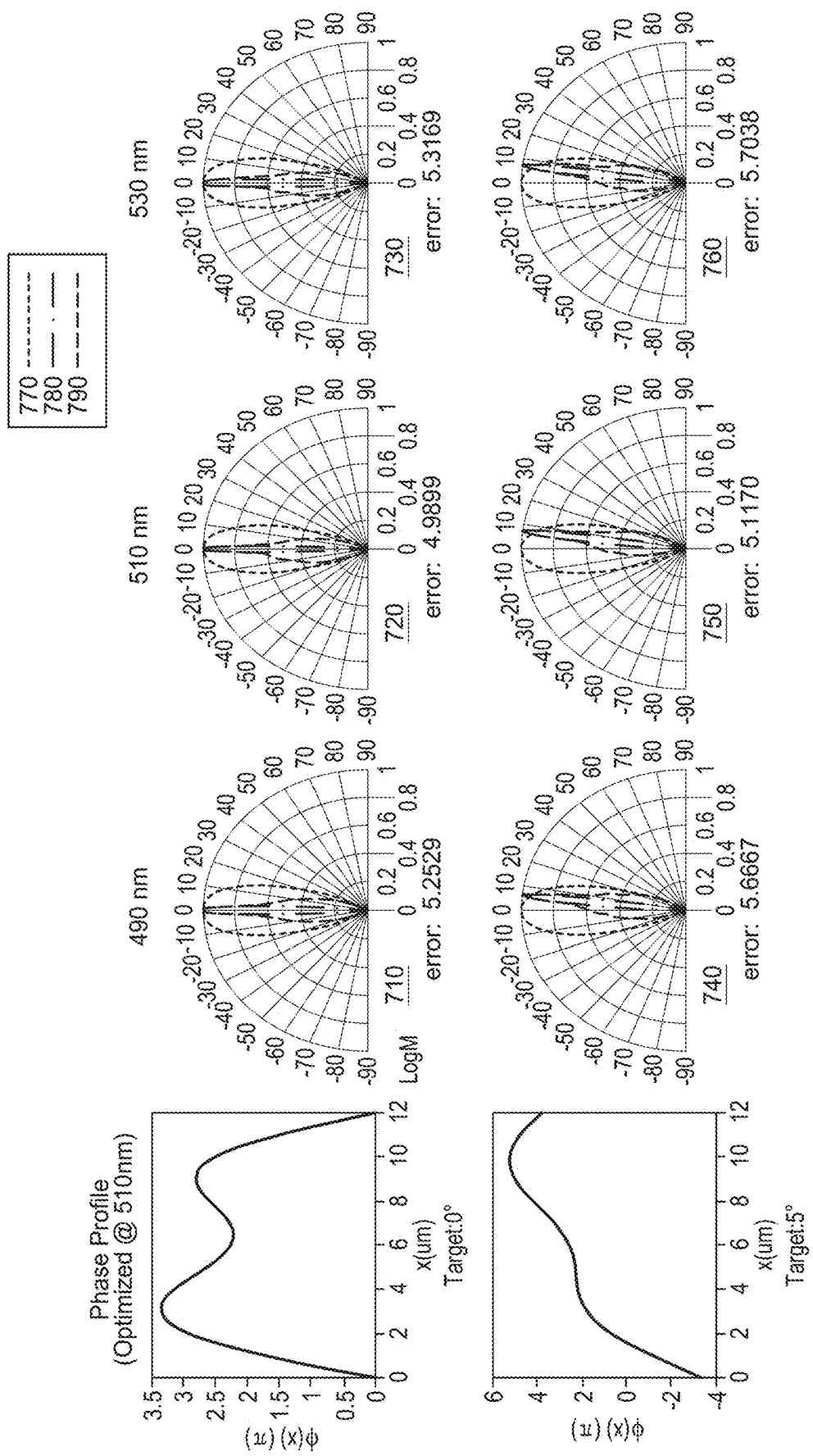
FIG. 7 illustrates graphs showing dispersion effects of the metasurface with respect to emitted light of various wavelengths, according to various embodiments.

FIG. 7 illustrates graphs showing dispersion effects of the metasurface with respect to emitted light of various wavelengths, according to one embodiment. In each graph 710, 720, 730, 740, 750, 760, line 770 is a source input, line 780 is a target input, and line 790 is a practical output in simulation. Graphs 710, 720, and 730 have a phase profile optimized at about 510 nm with a target deflection output of about 0°, and graphs 740, 750, and 760 have a phase profile optimized at about 510 nm with a target deflection output of about 5°. Graphs 710 and 740 illustrate the dispersion effects of the metasurface at a wavelength of about 490 nm, graphs 720 and 750 illustrate the dispersion effects of the metasurface at a wavelength of about 510 nm, and graphs 730 and 760 illustrate the dispersion effects of the metasurface at a wavelength of about 530 nm. As can be observed in FIG. 7, although the metasurface is optimized for 510 nm, the metasurface can still deflect light effectively for wavelengths of 490 nm or 530 nm. Therefore, the wavelength sensitivity for metasurfaces may not be a serious issue as long as the spectrum divergence is controlled in a reasonable degree. As such, with reasonable wavelength distribution, the dispersion of light through the metasurface is acceptable.

Figure 8A:
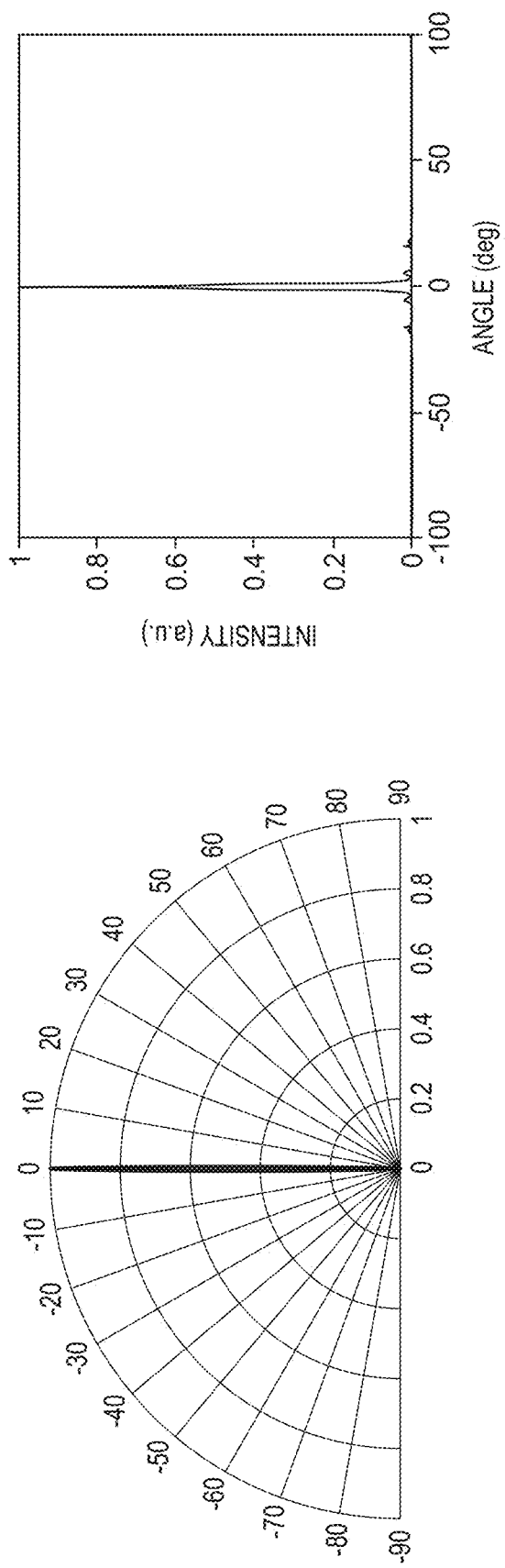
FIGS. 8A-8B illustrate the angular intensity distribution of corrugated OLED pixels with emitting dipoles at different locations of the corrugation, according to various embodiments.
Figure 8B:
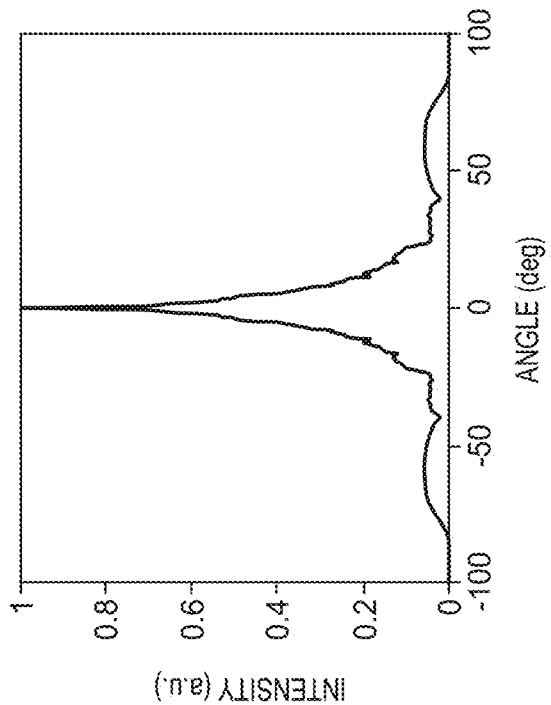
Figure 8B:
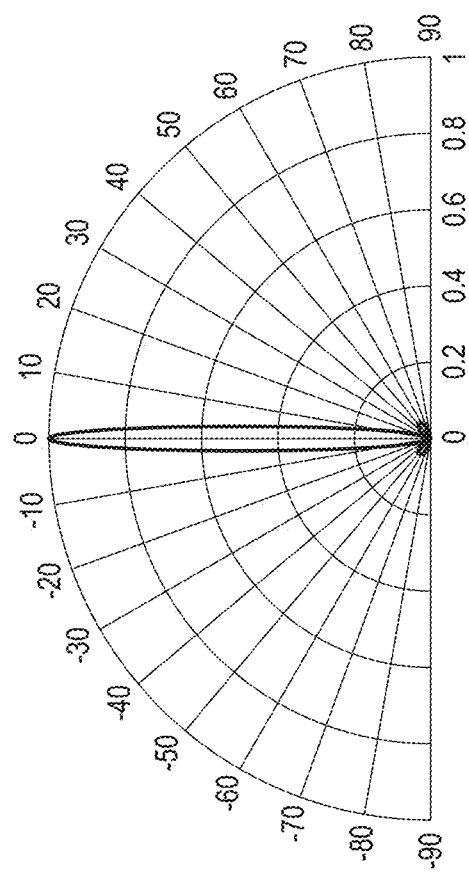

FIGS. 8A-8B illustrate exemplary angular intensity distribution of corrugated OLED pixels, according to some embodiments. In FIGS. 8A-8B, the output light field of dipoles are shown at different positions of the corrugation. In FIG. 8A, the dipole was set perfectly at the peak of corrugation, while in FIG. 8B the dipoles were set randomly at positions in the corrugation (e.g. peak, valley, or in the middle part), thus resulting in a weighted distribution. In both cases, the desired narrow emission profile was obtained by the introduction of corrugation OLED design.

Figure 9:
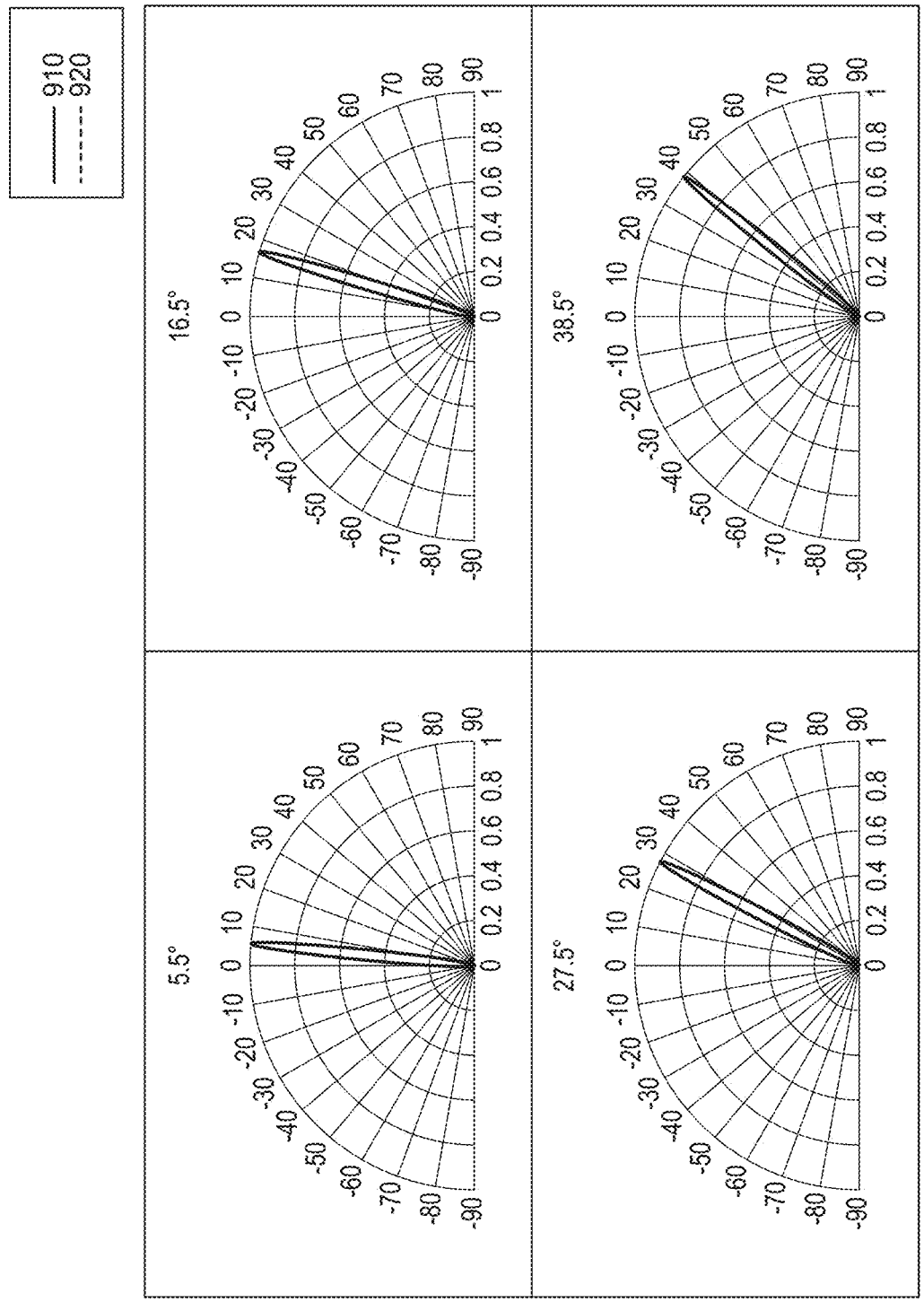
FIGS. 9 and 10 illustrate the angular emission profiles of different views from a light field pixel with the light sources of FIGS. 8A and 8B, respectively, according to various embodiments.
Figure 10:
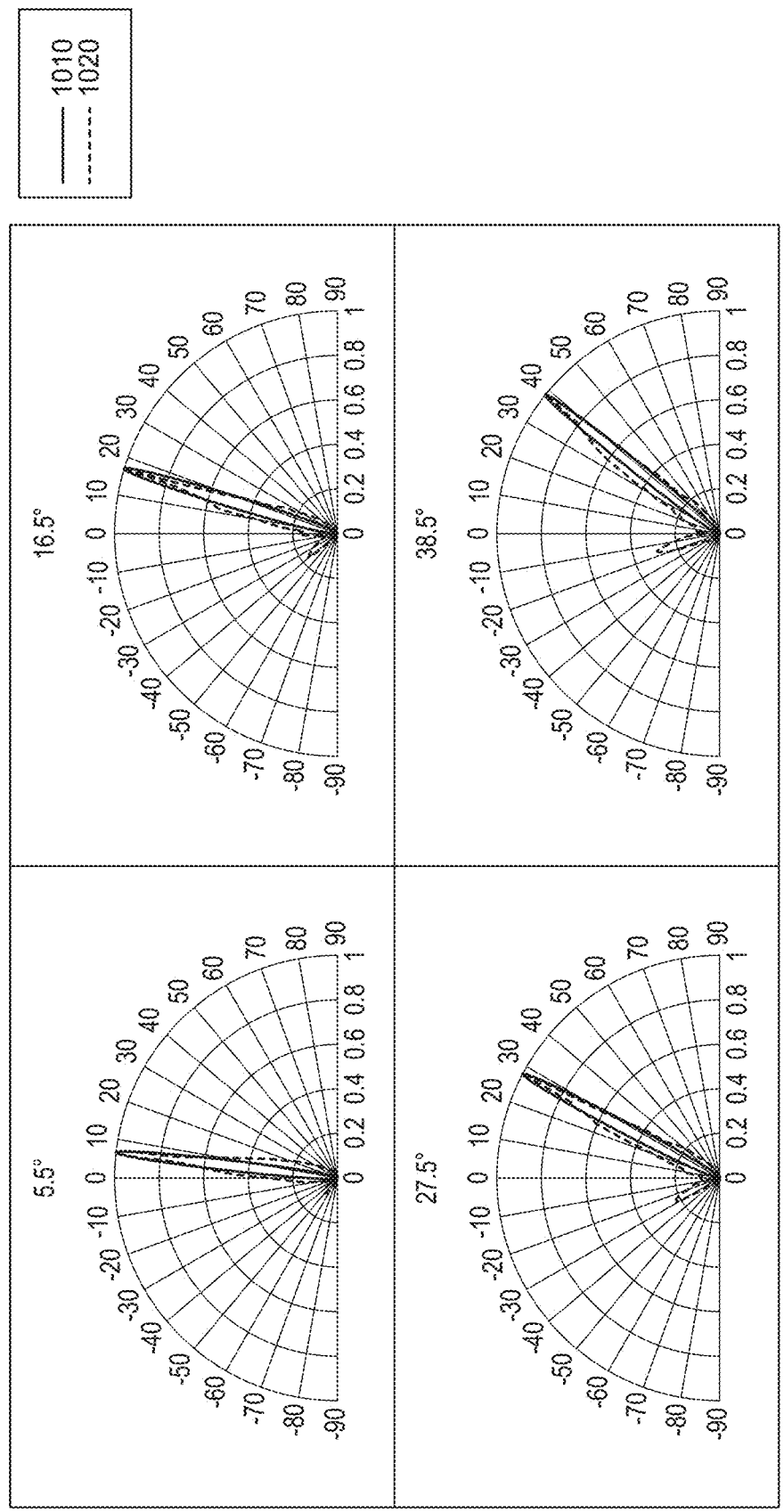

FIG. 9 and FIG. 10 illustrate the angular emission profiles of different views with light sources input from of FIGS. 8A and 8B, respectively. FIGS. 9 and 10 show the angular emission profiles of different views of corrugated OLED pixels at a wavelength of about 520 nm. Lines 910, 1010 are the target output field for the light field display and lines 920, 1020 are the resultant output field from the corrugated OLED pixel and metasurface under optimization. As shown in both FIGS. 9 and 10, a good match between target output field and resultant output field was obtained. The beam of emitted light from the OLED pixel is deflected into the target angle with minimal crosstalk, indicating a high quality of light field display can be obtained. Thus, as shown by FIGS. 8A-10, the OLED pixel having a corrugated surface combined with the cavity effect and the metasurface result in a light field display having high directivity and a low divergence of emitted light capable of producing high quality 3D images.

Therefore, a light field display comprising a plurality of corrugated OLED pixels, each OLED pixel comprising a plurality of corrugated primary and/or non-primary color subpixels, disposed adjacent to a plurality of median layers and a metasurface can be used to produce high quality 3D images. The corrugated OLED pixels and primary and/or non-primary color subpixels combined with the cavity effect reduce divergence of emitted light, resulting in smaller divergence angles, and thus, enable the following metasurface to deflect light effectively. The metasurface having components with higher refractive indices, a shorter period of building blocks, and a larger overall thickness enables the deflection and direction of the emitted light from the OLED pixels to be well controlled. Moreover, the spacing between the OLED pixels and the metasurface enables a smaller divergence angle from the OLED pixels and primary and/or non-primary color subpixels, further allowing the metasurface to deflect light to desired direction effectively and thus produce 3D images.

While the foregoing is directed to embodiments of the present disclosure, other and further embodiments of the disclosure may be devised without departing from the basic scope thereof, and the scope thereof is determined by the claims that follow.

What is claimed is:

1. A light field display, comprising:
   one or more self-emitting and high directivity light sources;
   one or more beam manipulating elements disposed adjacent to the one or more self-emitting and high directivity light sources; and
   a plurality of median layers disposed between and in contact with the one or more beam manipulating elements and the one or more self-emitting and high directivity light sources, wherein each of the one or more self-emitting and high directivity light sources produces a different angle or view of a same image to form a 3D image.

2. The light field display of claim 1, wherein the one or more self-emitting and high directivity light sources are a plurality of organic light emitting diode (OLED) pixels disposed in an array, the plurality of OLED pixels comprising at least three primary color subpixels.

3. The light field display of claim 2, wherein each OLED pixel of the plurality of OLED pixels comprises a corrugated surface, the corrugated surface being in contact with the plurality of median layers.

4. The light field display of claim 3, wherein a corrugation height of the corrugated surface of each of the OLED pixels is about 5 nm to about 500 nm, and a corrugation period of about 100 nm to about 1000 nm.

5. The light field display of claim 3, wherein the one or more beam manipulating elements have a size equal to or greater than a size of each OLED pixel.

6. The light field display of claim 1, wherein the one or more beam manipulating elements are one or more metasurfaces, each metasurface comprising a plurality of nanorods.

7. The light field display of claim 6, wherein the one or more metasurfaces each further comprises a filler layer disposed on and around the plurality of nanorods, the plurality of nanorods having a refractive index greater than a refractive index of the filler layer by at least 0.5, and wherein each of the plurality of nanorods has a height greater than about 100 nm.

8. A light field display, comprising:
an array of corrugated organic light emitting diode (OLED) pixels, the array comprising three or more primary color subpixels;
one or more metasurfaces disposed adjacent to the array of corrugated OLED pixels, the one or more metasurfaces each comprising a plurality of nanorods; and
a plurality of median layers disposed between and in contact with the one or more metasurfaces and the array of corrugated OLED pixels, wherein each of the corrugated OLED pixels in the array produces a different angle or view of a same image to form a 3D image.

9. The light field display of claim 8, wherein each corrugated OLED pixel is a top emitting pixel, and wherein the one or more metasurfaces are reflective or transmissive.

10. The light field display of claim 8, wherein each corrugated OLED pixel is a bottom emitting pixel, and wherein the one or more metasurfaces are reflective or transmissive.

11. The light field display of claim 8, wherein the one or more metasurfaces have a size equal to or greater than a size of each corrugated OLED pixel.

12. The light field display of claim 8, wherein a corrugation height of each of the corrugated OLED pixels is about 5 nm to about 500 nm, and a corrugation period of about 100 nm to about 1000 nm.

13. The light field display of claim 8, wherein each of the plurality of nanorods has a height greater than about 100 nm.

14. The light field display of claim 8, wherein the one or more metasurfaces each further comprises a filler layer disposed on and around the plurality of nanorods, the plurality of nanorods having a refractive index greater than a refractive index of the filler layer by at least 0.5.

15. A light field display, comprising:
a matrix of organic light emitting diode (OLED) pixels, the matrix comprising three or more primary color subpixels,
wherein each OLED pixel of the matrix comprises a corrugated surface,
wherein a corrugation height of the corrugated surface is about 5 nm to about 500 nm, and a corrugation period of the corrugation surface is about 100 nm to about 1000 nm, and
wherein each of the OLED pixels in the matrix produces a different angle or view of a same image to form a 3D image.

16. The light field display of claim 15, further comprising:
one or more beam manipulating elements disposed adjacent to the matrix of OLED pixels; and
a plurality of median layers disposed between and in contact with the one or more beam manipulating elements and the matrix of OLED pixels.

17. The light field display of claim 16, wherein the one or more beam manipulating elements are one or more metasurfaces, each metasurface comprising a plurality of nanorods.

18. The light field display of claim 17, wherein the one or more metasurfaces each further comprises a filler layer disposed on and around the plurality of nanorods, the plurality of nanorods having a refractive index greater than a refractive index of the filler layer by at least 0.5.

19. The light field display of claim 17, wherein each of the plurality of nanorods has a height greater than about 100 nm.

20. The light field display of claim 17, wherein the one or more metasurfaces have a size equal to or greater than a size of each OLED pixel.

* * * * *